United States Patent
Segawa et al.

(12) 
(10) Patent No.: US 6,281,562 B1
(45) Date of Patent: *Aug. 28, 2001

(54) SEMICONDUCTOR DEVICE WHICH REDUCES THE MINIMUM DISTANCE REQUIREMENTS BETWEEN ACTIVE AREAS

(75) Inventors: Mizuki Segawa; Isao Miyanaga; Toshiki Yabu; Takashi Nakabayashi; Takashi Uehara; Kyoji Yamashita; Takaaki Ukeda; Masatoshi Arai; Takayuki Yamada; Michikazu Matsumoto, all of Osaka (JP)

(73) Assignee: Matsushita Electric Industrial Co., Ltd., Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/685,726

(22) Filed: Jul. 24, 1996

(30) Foreign Application Priority Data

Jul. 27, 1995 (JP) .................................................. 7-192181
Dec. 19, 1995 (JP) .................................................. 7-330112

(51) Int. Cl.[7] .......................... H01L 29/167; H01L 29/00; H01L 21/331; H01L 21/76
(52) U.S. Cl. .......................... 257/510; 257/304; 257/774; 438/359; 438/424
(58) Field of Search .................................. 257/304, 510, 257/774, 311; 438/359, 424

(56) References Cited

U.S. PATENT DOCUMENTS

| | | | |
|---|---|---|---|
| 4,578,128 | * 3/1986 | Mundt et al. | 148/191 |
| 5,177,028 | 1/1993 | Manning | 437/41 |
| 5,196,910 | * 3/1993 | Moriuchi et al. | 257/510 |
| 5,286,674 | 2/1994 | Roth et al. | 437/190 |
| 5,319,235 | * 6/1994 | Kihara et al. | 257/370 |
| 5,397,910 | 3/1995 | Ishimaru | 257/387 |
| 5,401,673 | 3/1995 | Urayama | 437/187 |
| 5,413,961 | 5/1995 | Kim | 437/195 |
| 5,433,794 | * 7/1995 | Fazan et al. | 148/33.3 |
| 5,497,016 | * 3/1996 | Koh | 257/306 |
| 5,521,422 | * 5/1996 | Mandelman et al. | 257/510 |
| 5,561,311 | * 10/1996 | Hamamoto et al. | 257/309 |
| 5,777,370 | * 7/1998 | Omid-Zohoor et al. | 257/374 |
| 5,804,862 | * 9/1998 | Matumoto | 257/396 |
| 6,022,781 | * 2/2000 | Noble, Jr. et al. | 438/296 |

FOREIGN PATENT DOCUMENTS

| | | |
|---|---|---|
| 0 243 988 | 11/1987 | (EP) . |
| 0 513 639 | 11/1992 | (EP) . |
| 4-68564 | * 3/1992 | (JP) .................................. 257/510 |
| 6-163843 | 6/1994 | (JP) . |

* cited by examiner

Primary Examiner—Olik Chaudhuri
Assistant Examiner—Howard Weiss
(74) Attorney, Agent, or Firm—McDermott, Will & Emery

(57) ABSTRACT

An isolation which is higher in a stepwise manner than an active area of a silicon substrate is formed. On the active area, an FET including a gate oxide film, a gate electrode, a gate protection film, sidewalls and the like is formed. An insulating film is deposited on the entire top surface of the substrate, and a resist film for exposing an area stretching over the active area, a part of the isolation and the gate protection film is formed on the insulating film. There is no need to provide an alignment margin for avoiding interference with the isolation and the like to a region where a connection hole is formed. Since the isolation is higher in a stepwise manner than the active area, the isolation is prevented from being removed by over-etch in the formation of a connection hole to come in contact with a portion where an impurity concentration is low in the active area. In this manner, the integration of a semiconductor device can be improved and an area occupied by the semiconductor device can be decreased without causing degradation of junction voltage resistance and increase of a junction leakage current in the semiconductor device.

12 Claims, 21 Drawing Sheets

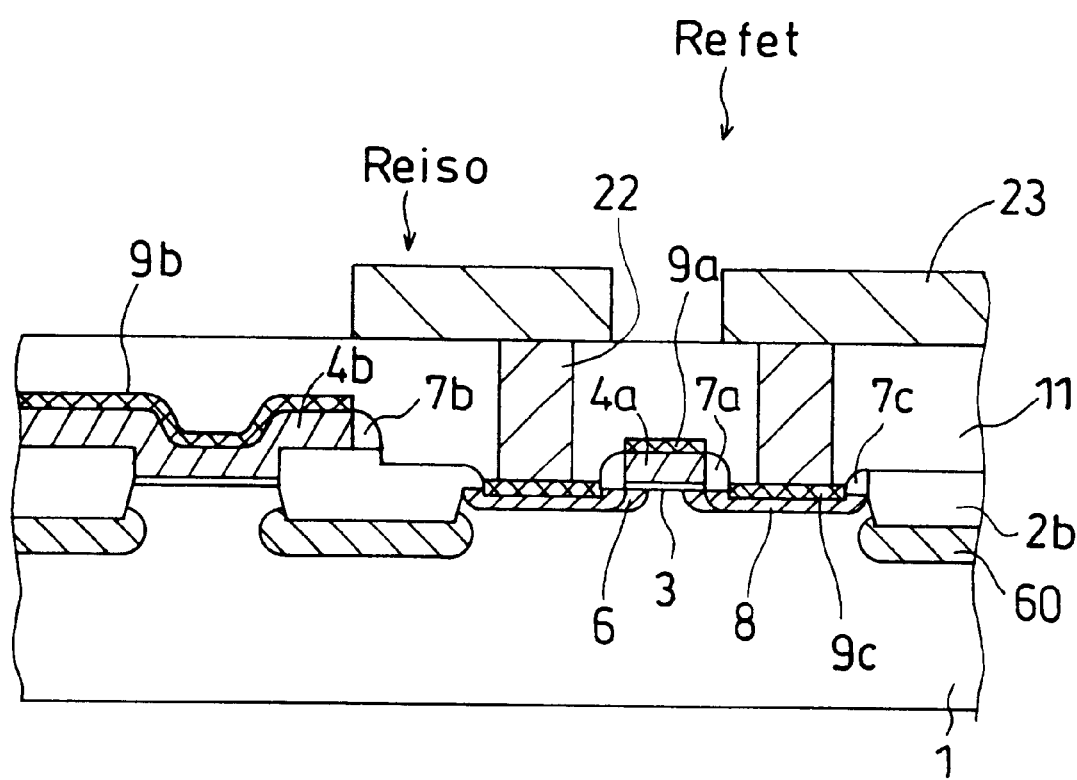

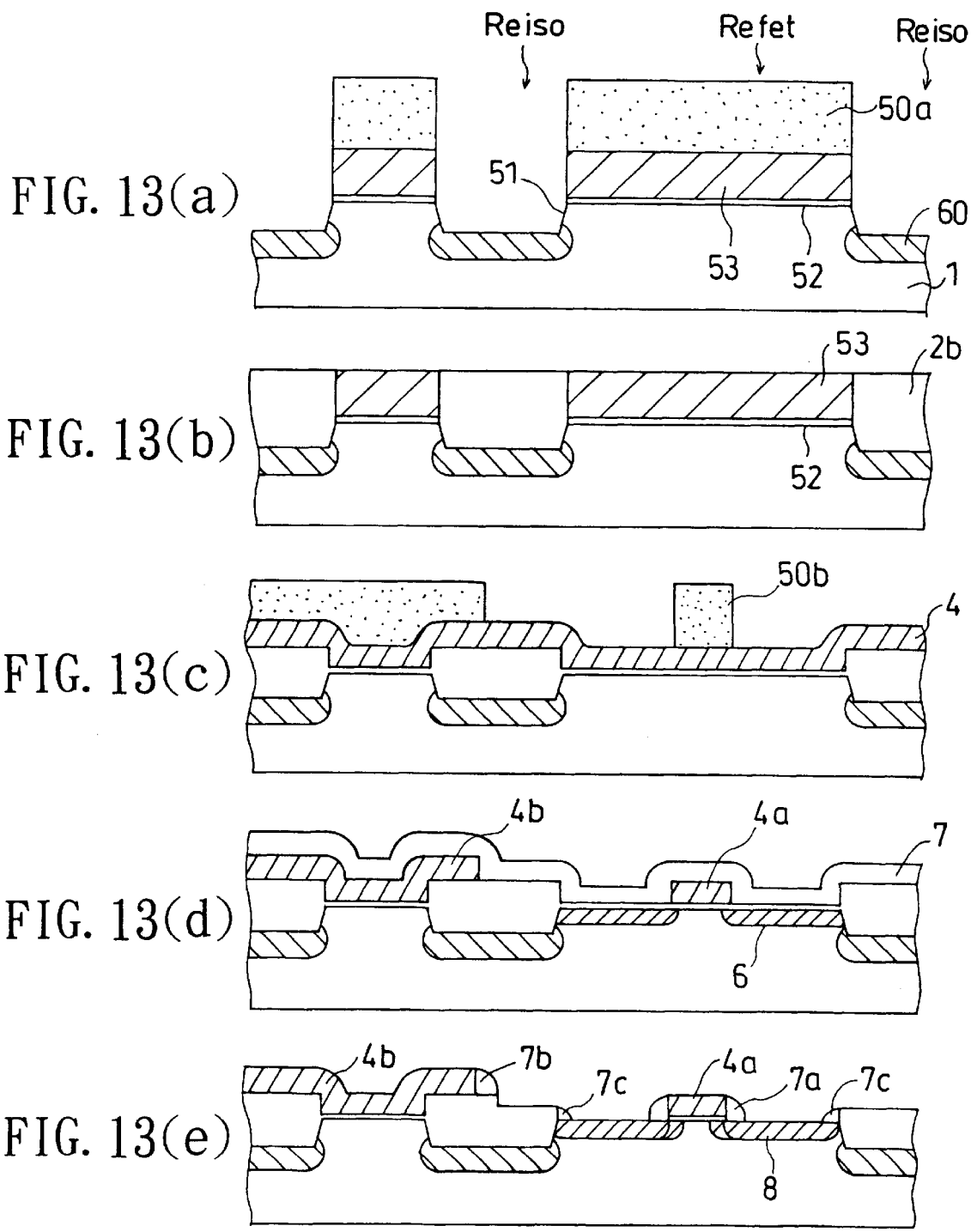

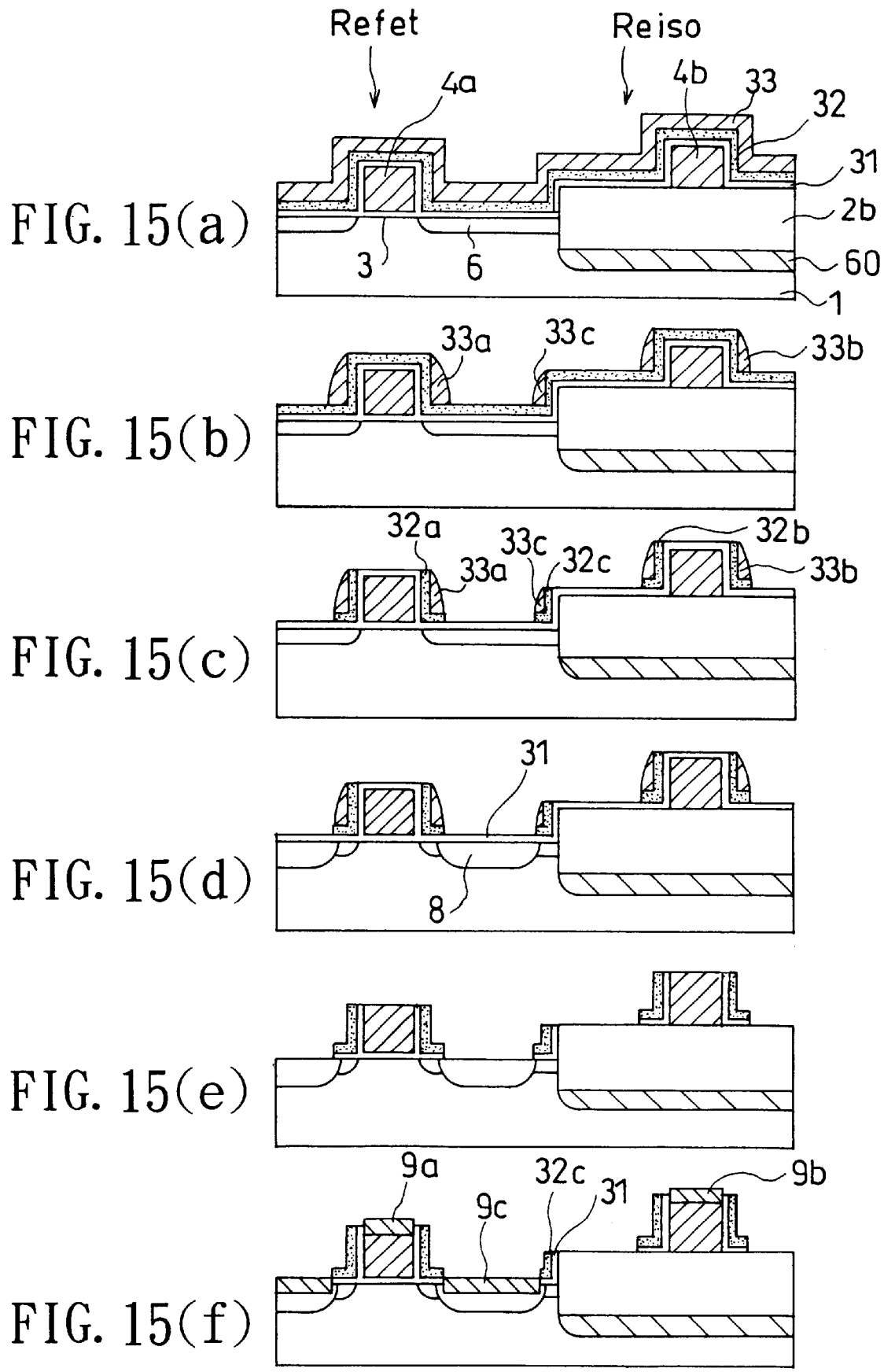

SEMICONDUCTOR DEVICE WHICH REDUCES THE MINIMUM DISTANCE REQUIREMENTS BETWEEN ACTIVE AREAS

BACKGROUND OF THE INVENTION

The present invention relates to a semiconductor device including transistors and connection between the transistors for constituting an LSI with high integration and a decreased area.

With the recent development of a semiconductor device with high integration and high performance, there are increasing demands for more refinement of the semiconductor device. The improvement of the conventional techniques cannot follow these demands, and novel techniques are unavoidably introduced in some technical fields. For example, as a method of forming an isolation, the LOCOS isolation method is conventionally adopted in view of its simpleness and low cost. Recently, however, it is considered that a trench buried type isolation (hereinafter referred to as the trench isolation) is more advantageous for manufacturing a refined semiconductor device.

Specifically, in the LOCOS isolation method, since selective oxidation is conducted, the so-called bird's beak occurs in the boundary with a mask for preventing the oxidation. As a result, the dimension of a transistor is changed because an insulating film of the isolation invades a transistor region against the actually designed mask dimension. This dimensional change is unallowable in the refinement of a semiconductor device after the 0.5 μm generation. Therefore, even in the mass-production techniques, the isolation forming method has started to be changed to the trench isolation method in which the dimensional change is very small. For example, IBM corporation has introduced the trench isolation structure as a 0.5 μm CMOS process for the mass-production of an MPU (IBM Journal of Research and Development, VOL. 39, No. 1/2, 1995, pp. 33–42).

Furthermore, in a semiconductor device mounting elements such as a MOSFET in an active area surrounded with an isolation, an insulating film is deposited on the active area, the isolation and a gate electrode, and a contact hole is formed by partly exposing the insulating film for connection between the active area and an interconnection member on a layer above the insulating film. This structure is known as a very common structure for the semiconductor device.

FIG. 17 is a sectional view for showing the structure of a conventional semiconductor device. In FIG. 17, a reference numeral 1 denotes a silicon substrate, a reference numeral 2b denotes an isolation with a trench isolation structure which is made of a silicon oxide film and whose top surface is flattened so as to be at the same level as the top surface of the silicon substrate 1, a reference numeral 3 denotes a gate oxide film made of a silicon oxide film, a reference numeral 4a a denotes a polysilicon electrode working as a gate electrode, a reference numeral 4b denotes a polysilicon interconnection formed simultaneously with the polysilicon electrode 4a, a reference numeral 6 denotes a low-concentration source/drain region formed by doping the silicon substrate with an n-type impurity at a low concentration, a reference numeral 7a denotes an electrode sidewall, a reference numeral 7b denotes an interconnection sidewall, a reference numeral 8 denotes a high-concentration source/drain region formed by doping the silicon substrate with an n-type impurity at a high concentration, a reference numeral 12 denotes an insulating film made of a silicon oxide film, and a reference numeral 13 denotes a local interconnection made of a polysilicon film formed on the insulating film 12.

The local interconnection 13 is also filled within a connection hole 14 formed in a part of the insulating film 12, so as to be contacted with the source/drain region in the active area through the connection hole 14. In this case, the connection hole 14 is formed apart from the isolation 2b by a predetermined distance. In other words, in the conventional layout rule for such a semiconductor device, there is a rule that the edge of a connection hole is previously located away from the boundary between the active area and the isolation region so as to prevent a part of the connection hole 14 from stretching over the isolation 2b even when a mask alignment shift is caused in photolithography (this distance between the connection hole and the isolation is designated as an alignment margin).

However, in the structure of the semiconductor device as shown in FIG. 17, there arise problems in the attempts to further improve the integration for the following reason:

A distance La between the polysilicon electrode 4a and the isolation 2b is estimated as an index of the integration. In order to prevent the connection hole 14 from interfering the isolation 2b as described above, the distance La is required to be 1.2 μm, namely, the sum of the diameter of the connection hole 14, that is, 0.5 μm, the width of the electrode sidewall 7a, that is, 0.1 μm, the alignment margin from the polysilicon electrode 4a, that is, 0.3 μm, and the alignment margin from the isolation 2b, that is, 0.3 μm. A connection hole has attained a more and more refined diameter with the development of processing techniques, and also a gate length has been decreased as small as 0.3 μm or less. Still, the alignment margin in consideration of the mask alignment shift in the photolithography is required to be approximately 0.3 μm. Accordingly, as the gate length and the connection hole diameter are more refined, the proportion of the alignment margin is increased. This alignment margin has become an obstacle to the high integration.

Therefore, attempts have been made to form the connection hole 14 without considering the alignment margin in view of the alignment shift in the photolithography. Manufacturing procedures adopted in such a case will now be described by exemplifying an n-channel MOSFET referring to FIGS. 18(a) through 18(c).

First, as is shown in FIG. 18(a), after forming an isolation 2b having the trench structure in a silicon substrate 1 doped with a p-type impurity (or p-type well), etch back or the like is conducted for flattening so as to place the surfaces of the isolation 2b and the silicon substrate 1 at the same level. In an active area surrounded with the isolation 2b, a gate oxide film 3, a polysilicon electrode 4a serving as a gate electrode, an electrode sidewall 7a, a low-concentration source/drain region 6 and a high-concentration source/drain region 8 are formed. On the isolation 2b are disposed a polysilicon interconnection 4b formed simultaneously with the polysilicon electrode 4a and an interconnection sidewall 7b. At this point, the top surface of the high-concentration source/drain region 8 in the active area is placed at the same level as the top surface of the isolation 2b. Then, an insulating film 12 of a silicon oxide film is formed on the entire top surface of the substrate.

Next, as is shown in FIG. 18(b), a resist film 25a used as a mask for forming a connection hole is formed on the insulating film 12, and the connection hole 14 is formed by, for example, dry etching.

Then, as is shown in FIG. 18(c), the resist film 25a is removed, and a polysilicon film is deposited on the insulating film 12 and within the connection hole 14. The polysilicon film is then made into a desired pattern, thereby forming a local interconnection 13.

At this point, in the case where the alignment margin in view of the mask alignment shift in the formation of the connection hole 14 is not considered in estimating the distance La between the polysilicon electrode 4a and the isolation 2b, a part of the isolation 2b is included in the connection hole 14 when the exposing area of the resist film 25a is shifted toward the isolation 2b due to the mask alignment shift in the photolithography. Through over-etch in conducting the dry etching of the insulating film 12, although the high-concentration source/drain region 8 made of the silicon substrate is not largely etched because of its small etching rate, the part of the isolation 2b included in the connection hole 14 is selectively removed, resulting in forming a recess 40 in part of the connection hole 14. When the recess 40 in the connection hole 14 has a depth exceeding a given proportion to the depth of the high-concentration source/drain region 8, junction voltage resistance can be decreased and a junction leakage current can be increased because the concentration of the impurity in the high-concentration source/drain region 8 is low at that depth.

In order to prevent these phenomena, it is necessary to provide a predetermined alignment margin as is shown in the structure of FIG. 17 so as to prevent the connection hole 14 from interfering the isolation 2b even when the alignment shift is caused in the lithography. In this manner, in the conventional layout rule for a semiconductor device, an alignment margin in view of the mask alignment shift in the photolithography is unavoidably provided.

Furthermore, a distance between the polysilicon electrode 4a and the connection hole 14 is also required to be provided with an alignment margin. Otherwise, the connection hole 14 can interfere the polysilicon electrode 4a due to the fluctuation caused in the manufacturing procedures, resulting in causing electric short-circuit between an upper layer interconnection buried in the connection hole and the gate electrode.

As described above, it is necessary to provide the connection hole 14 with margins for preventing the interference with other elements around the connection hole, which has become a large obstacle to the high integration of an LSI.

Also in the case where a semiconductor device having the so-called salicide structure is manufactured, the following problems are caused due to a recess formed in the isolation:

FIG. 19 is a sectional view for showing an example of a semiconductor device including the conventional trench isolation and a MOSFET having the salicide structure. As is shown in FIG. 19, a trench isolation 105a is formed in a silicon substrate 101. In an active area surrounded with the isolation 105a, a gate insulating film 103a, a gate electrode 107a, and electrode sidewalls 108a on both side surfaces of the gate electrode 107a are formed. Also in the active area, a low-concentration source/drain region 106a and a high-concentration source/drain region 106b are formed on both sides of the gate electrode 107a. A channel stop region 115 is formed below the isolation 105a. Furthermore, in areas of the silicon substrate 101 excluding the isolation 105a and the active area, a gate interconnection 107b made of the same polysilicon film as that for the gate electrode 107a is formed with a gate insulating film 103b sandwiched, and the gate interconnection 106b is provided with interconnection sidewalls 108b on its both side surfaces. On the gate electrode 107a, the gate interconnection 107b and the high-concentration source/drain region 106b, an upper gate electrode 109a, an upper gate interconnection 109b and a source/drain electrode 109c each made of silicide are respectively formed. Furthermore, this semiconductor device includes an interlayer insulating film 111 made of a silicon oxide film, a metallic interconnection 112 formed on the interlayer insulating film 111, and a contact member 113 (buried conductive layer) filled in a connection hole formed in the interlayer insulating film 111 for connecting the metallic interconnection 112 with the source/drain electrode 109c.

Now, the manufacturing procedures for the semiconductor device including the conventional trench isolation and the MOSFET with the salicide structure shown in FIG. 19 will be described referring to FIGS. 20(a) through 20(e).

First, as is shown in FIG. 20(a), a silicon oxide film 116 and a silicon nitride film 117 are successively deposited on a silicon substrate 101, and a resist film 120 for exposing an isolation region and masking a transistor region is formed on the silicon nitride film 117. Then, by using the resist film 120 as a mask, etching is conducted, so as to selectively remove the silicon nitride film 116 and the silicon oxide film 117, and further etch the silicon substrate 101, thereby forming a trench 104. Then, impurity ions are injected into the bottom of the trench 104, thereby forming a channel stop region 115.

Then, as is shown in FIG. 20(b), a silicon oxide film (not shown) is deposited, and the entire top surface is flattened until the surface of the silicon nitride film 117 is exposed. Through this procedure, a trench isolation 105a made of the silicon oxide film filled in the trench 104 is formed in the isolation region Reiso.

Next, as is shown in FIG. 20(c), after the silicon nitride film 117 and the silicon oxide film 116 are removed, a gate oxide film 103 is formed on the silicon substrate 101, and a polysilicon film 107 is deposited thereon. Then, a photoresist film 121 for exposing areas excluding a region for forming a gate is formed on the polysilicon film 107.

Then, as is shown in FIG. 20(d), by using the photoresist film 121 as a mask, dry etching is conducted, thereby selectively removing the polysilicon film 107 and the gate oxide film 103. Thus, a gate electrode 107a of the MOSFET in the transistor region Refet and a gate interconnection 106b stretching over the isolation 105a and the silicon substrate 101 are formed. After removing the photoresist film 121, impurity ions are injected into the silicon substrate 101 by using the gate electrode 107a as a mask, thereby forming a low-concentration source/drain region 106a. Then, a silicon oxide film 108 is deposited on the entire top surface of the substrate.

Next, as is shown in FIG. 20(e), the silicon oxide film 108 is anisotropically dry-etched, thereby forming electrode sidewalls 108a and interconnection sidewalls 108b on both side surfaces of the gate electrode 107a and the gate interconnection 106b, respectively. At this point, the gate oxide film 103 below the silicon oxide film 108 is simultaneously removed, and the gate oxide film 103 below the gate electrode 107a alone remains. Then, impurity ions are diagonally injected by using the gate electrode 107a and the electrode sidewalls 108a as masks, thereby forming a high-concentration source/drain region 106b. Then, after a Ti film is deposited on the entire top surface, high temperature annealing is conducted, thereby causing a reaction between the Ti film and the components made of silicon directly in contact with the Ti film. Thus, an upper gate electrode 109a, an upper gate interconnection 109b and a source/drain electrode 109c made of silicide are formed.

The procedures to be conducted thereafter are omitted, but the semiconductor device including the MOSFET having the structure as shown in FIG. 19 can be ultimately manufactured. In FIG. 19, the metallic interconnection 112 is formed on the interlayer insulating film 111, and the metallic interconnection 112 is connected with the source/drain electrode 109c through the contact member 113 including a W plug and the like filled in the contact hole.

When the aforementioned trench isolation structure is adopted, the dimensional change of the source/drain region can be suppressed because the bird's beak, that is, the oxide film invasion of an active area, which is caused in the LOCOS method where a thick silicon oxide film is formed by thermal oxidation, can be avoided. Furthermore, in the procedure shown in FIG. 20(c), the surfaces of the isolation 105a and the silicon substrate 101 in the transistor region Refet are placed at the same level.

In such a semiconductor device having the trench type isolation, however, there arise the following problems:

When the procedures proceed from the state shown in FIG. 20(d) to the state shown in FIG. 20(e), the silicon oxide film 108 is anisotropically etched so as to form the sidewalls 108a and 108b. At this point, over-etch is required. Through this over-etch, the surface of the isolation 105a is removed by some depth.

FIGS. 21(a) and 21(b) are enlarged sectional views around the boundary between the high-concentration source/drain region 106b and the isolation 105a after this over-etch.

As is shown in FIG. 21(a), between the procedures shown in FIGS. 20(d) and 20(e), the impurity ions are diagonally injected so as to form the high-concentration source/drain region 106b. Through this ion injection, the high-concentration source/drain region 106b is formed also below the edge of the isolation 105a because the isolation 105a is previously etched by some depth. Accordingly, the high-concentration source/drain region 106b is brought closer to the channel stop region 115, resulting in causing the problems of degradation of the junction voltage resistance and increase of the junction leakage current.

In addition, as is shown in FIG. 21(b), in the case where the Ti film or the like is deposited on the high-concentration source/drain region 106b so as to obtain the silicide layer through the reaction with the silicon below, the thus formed silicide layer can invade the interface between the silicon substrate 101 and the isolation 105a with ease. As a result, a short-circuit current can be caused between the source/drain electrode 109c made of silicide and the channel stop region 115.

SUMMARY OF THE INVENTION

The object of the present invention is improving the structure of an isolation, so as to prevent the problems caused because the edge of the isolation is trenched in etching for the formation of a connection hole or sidewalls.

In order to achieve the object, the invention proposes first and second semiconductor devices and first through third methods of manufacturing a semiconductor device as described below.

The first semiconductor device of this invention in which a semiconductor element is disposed in each of plural active areas in a semiconductor substrate comprises an isolation for surrounding and isolating each active area, the isolation having a top surface at a higher level than a surface of the active area and having a step portion in a boundary with the active area; an insulating film formed so as to stretch over each active area and the isolation; plural holes each formed by removing a portion of the insulating film disposed at least on the active area; plural buried conductive layers filled in the respective holes; and plural interconnection members formed on the insulating film so as to be connected with the respective active areas through the respective buried conductive layers.

Owing to this structure, in the case where a part of or all the holes are formed so as to stretch over the active areas and the isolation due to mask alignment shift in photolithography, a part of the isolation is removed by over-etch for ensuring the formation of the holes. In such a case, even when the top surface of the isolation is trenched to be lower than the surface of the active area, the depth of the holes formed in the isolation is small in the boundary with the active area because of the level difference between the top surface of the isolation and the surface of the active area. Accordingly, degradation of the junction voltage resistance and increase of the junction leakage current can be suppressed. Therefore, there is no need to provide a portion of the active area where each hole is formed with an alignment margin for avoiding the interference with the isolation caused by the mask alignment shift in the lithography. Thus, the area of the active area can be decreased, resulting in improving the integration of the semiconductor device.

In the first semiconductor device, at least a part of the plural holes can be formed so as to stretch over the active area and the isolation due to fluctuation in manufacturing procedures.

In other words, even when no margin for the mask alignment in the lithography is provided, the problems caused in the formation of the holes can be avoided.

Furthermore, the angle between a side surface of the step portion and the surface of the active area is preferably 70 degrees or more.

As a result, when the hole interferes the isolation, the part of the isolation included in the hole is definitely prevented from being etched through over-etch in the formation of the holes down to a depth where the impurity concentration is low in the active area.

The isolation is preferably a trench isolation made of an insulating material filled in a trench formed by trenching the semiconductor substrate by a predetermined depth.

This is because no bird's beak is caused in the trench isolation differently from a LOCOS film as described above, and hence, the trench isolation is suitable particularly for the high integration and refinement of the semiconductor device.

In the first semiconductor device, when the semiconductor element is a MISFET including a gate insulating film and a gate electrode formed on the active area; and source/drain regions formed in the active area on both sides of the gate electrode, the following preferred embodiments can be adopted:

The semiconductor device can further comprise a gate interconnection made of the same material as that for the gate electrode and formed on the isolation, each of the holes can be formed on an area including the source/drain region, the isolation and the gate interconnection, and the plural interconnection members can be connected with the gate interconnection on the isolation.

Owing to this configuration, in the case where the interconnection members work as local interconnections for connecting a gate interconnection on the isolation with the active area, there is no need to separately form holes in the insulating film on the gate interconnection and the insulating film on the active area. In addition, there is no need to provide the separate holes with alignment margins from the boundary between the active area and the isolation. Accordingly, the area of the isolation can also be decreased, resulting in largely improving the integration of the semiconductor device.

The semiconductor device can further comprise electrode sidewalls made of an insulating material and formed on both side surfaces of the gate electrode; and a step sidewall made of the same material as the insulating material for the electrode sidewalls and formed on the side surface of the step portion. In this semiconductor device, at least a part of the holes can be formed by also removing a portion of the insulating film disposed on the step sidewall.

Owing to this structure, the abrupt level difference between the surfaces of the isolation and the active area can be released by the step sidewall. Therefore, a residue is scarcely generated in patterning the interconnection members, and an upper interconnection is prevented from being disconnected and increasing in its resistance.

The semiconductor device can further comprise a gate protection film formed on the gate electrode, and at least a part of the holes can be formed so as to stretch over the source/drain region and at least a part of the gate protection film.

Owing to this structure, a part of the gate protection film included in the hole is removed by the over-etch in the formation of the holes. However, the gate electrode is protected by the gate protection film, and hence, electrical short circuit between the gate electrode and the interconnection member can be prevented. Accordingly, there is no need to provide an alignment margin from the gate electrode in the area where each hole is formed, resulting in further improving the integration.

The interconnection members can be first layer metallic interconnections, and the insulating film can be an interlayer insulating film disposed between the semiconductor substrate, and the first layer metallic interconnections. In this case, the semiconductor device preferably further comprises, between the interlayer insulating film and the semiconductor substrate an underlying film made of an insulating material having high etching selectivity against the interlayer insulating film.

The second semiconductor device of this invention in which a semiconductor element is disposed in each of plural active areas in a semiconductor substrate comprises a trench isolation for isolating and surrounding each active area, the trench isolation having a top surface at a higher level than a surface of the active area and having a step portion in a boundary with the active area; and a step sidewall formed on the side surface of the step portion of the trench isolation.

Owing to this structure, in the impurity ion injection for the formation of an impurity diffused layer of the semiconductor device, the step sidewall disposed at the edge of the trench isolation can prevent the impurity ions from being implanted below the edge of the isolation. Furthermore, also in adopting the structure including a source/drain electrode made of silicide, the step sidewall can prevent the silicide layer from being formed at a deep portion. Therefore, a short circuit current can be prevented from occurring between the source/drain electrode and a substrate region such as the channel stop region. In this manner, the function of the trench isolation to isolate each semiconductor element can be prevented from degrading.

In the second semiconductor device, the step sidewall is preferably made of an insulating material.

Also in the second semiconductor device, the semiconductor element can be a MISFET including a gate insulating film and a gate electrode formed on the active area; and source/drain regions formed in the active area on both sides of the gate electrode. This semiconductor device can be further provided with electrode sidewalls formed on both side surfaces of the gate electrode, and the step sidewall can be formed simultaneously with the electrode sidewalls.

Owing to this structure, the semiconductor elements can be a MISFET having the LDD structure suitable for the refinement. Because of this structure together with the trench isolation structure, the semiconductor device can attain a structure particularly suitable for the refinement and the high integration.

The first method of manufacturing a semiconductor device in which a semiconductor element is disposed in each of plural active areas in a semiconductor substrate comprises a first step of forming an isolation in a part of the semiconductor substrate, the isolation having a top surface at a higher level than a surface of the semiconductor substrate and having a step portion in a boundary with the surface of the semiconductor substrate; a second step of introducing an impurity at a high concentration into each active area of the semiconductor substrate surrounded by the isolation; a third step of forming an insulating film on the active area and the isolation; a fourth step of forming, on the insulating film, a masking member having an exposing area above an area at least including a portion of the active area where the impurity at the high concentration is introduced; a fifth step of conducting etching by using the masking member so as to selectively remove the insulating film and form holes; and a sixth step of forming a buried conductive layer by filling the holes with a conductive material and forming, on the insulating film, interconnection members to be connected with the buried conductive layer. In this method, in the fourth step, an alignment margin is not provided for preventing the exposing area of the masking member from including a portion above the isolation when mask shift is caused in photolithography.

In adopting this method, even when a part of the isolation is removed by over-etch in the fifth step so that the top surface of the isolation is etched to be lower than the surface of the active area, the depth of the holes formed in the isolation is small because of the level difference between the isolation and the active area. Accordingly, the decrease of the junction voltage resistance and the increase of the junction leakage current can be suppressed in the manufactured semiconductor device. In addition, the area of the active area can be decreased because no alignment margin from the isolation is provided, resulting in improving the integration of the manufactured semiconductor device.

In the first method of manufacturing a semiconductor device, the following preferred embodiments can be adopted:

The fifth step is preferably performed so as to satisfy the following inequality:

$$OE \times a \times (ER2/ER1) \leq b + D \times (2/10)$$

wherein "a" indicates a thickness of the insulating film, "b" indicates a level difference between the surface of the active area and the top surface of the isolation, "ER1" indicates an etching rate of the insulating film, "ER2" indicates an etching rate of the isolation, "D" indicates a depth of an impurity diffused layer in the active area, and "OE" indicates an over-etch ratio of the insulating film.

In adopting this method, even when a part of the isolation included in the hole is removed by over-etch in the formation of the holes, the bottom of the etched portion does not reach a portion where the impurity concentration is low in the active area. In other words, the top surface of the isolation is never placed at a lower level than the surface of the active area. Accordingly, the degradation of the junction voltage resistance and the increase of the junction leakage current can be definitely prevented in the manufactured semiconductor device.

When the semiconductor element is a MISFET, the method can further include, before the second step, a step of forming a gate insulating film on the active area, a step of depositing a conductive film on the gate insulating film and a step of forming a gate electrode by patterning the conducive film, and in the second step, the impurity at the high concentration is introduced so as to form a source/drain region. In such a case, the following preferred embodiments can be adopted.

The method can further comprise, after the step of depositing the conductive film, a step of depositing a protection insulating film on the conductive film, and in the step of forming the gate electrode, the conductive film as well as the protection insulating film are patterned, so as to form a gate protection film on the gate electrode. The fifth step can be performed so as to satisfy the following inequality:

$$OE \times a \times (ER3/ER1) < c$$

wherein "a" indicates a thickness of the insulating film, "c" indicates a thickness of the gate protection film, "ER1" indicates an etching rate of the insulating film, "ER3" indicates an etching rate of the gate protection film and "OE" indicates an over-etch ratio of the insulating film.

When this method is adopted, while the area of the active area is decreased by not providing an alignment margin for avoiding the interference between the connection hole and the gate electrode, the hole is prevented from reaching the gate electrode below the gate protection film.

In the fourth step, the masking member can be formed to be positioned without providing a margin for preventing the exposing area thereof from including a portion above the gate protection film even when the mask shift is caused in the photolithography.

Alternatively, in the fourth step, the masking member can be formed to be positioned with the exposing area thereof including at least a part of a portion above the gate protection film when the mask shift is not caused in the photolithography.

In the third step, an interlayer insulating film can be formed as the insulating film, and in the sixth step, first layer metallic interconnections can be formed as the interconnection members. In such a case, it is preferred that the interlayer insulating film is formed in the third step after an underlying film made of an insulating material having high etching selectivity against the interlayer insulating film is formed below the interlayer insulating film.

The second method of manufacturing a semiconductor device of this invention comprises a first step of forming an underlying insulating film on a semiconductor substrate; a second step of depositing an etching stopper film on the underlying insulating film; a third step of forming a trench by exposing a portion of the etching stopper film and the underlying insulating film where an isolation is to be formed and etching the semiconductor substrate in the exposed portion; a fourth step of depositing an insulating film for isolation on an entire top surface of the substrate, flattening the substrate until at least a surface of the etching stopper film is exposed, and forming a trench isolation in the trench so as to surround a transistor region; a fifth step of removing, by etching, at least the etching stopper film and the underlying insulating film, so as to expose a step portion between the transistor region and the trench isolation; a sixth step of depositing a gate oxide film and a conductive film on the substrate and making the conductive film into a pattern of at least a gate electrode; a seventh step of depositing an insulating film for sidewalls on the entire top surface of the substrate and anisotropically etching the insulating film for the sidewalls, so as to form electrode sidewalls and a step sidewall on side surfaces of the gate electrode and the step portion, respectively; and an eighth step of introducing an impurity into the semiconductor substrate in the transistor region on both sides of the gate electrode, so as to form source/drain regions.

When this method is adopted, since the step sidewall is formed between the semiconductor substrate in the transistor region and the trench isolation after completing the fifth step, the impurity ions are prevented from being implanted below the edge of the trench isolation in the impurity ion injection in the eighth step. Furthermore, also when an area in the vicinity of the surface of the source/drain region is subsequently silicified, the step sidewall made of the insulating film can prevent the silicide layer from being formed at a deep portion. Accordingly, not only the degradation of the junction voltage resistance and the current leakage but also the occurrence of a short circuit current between the source/drain electrode and the substrate region such as the channel stop region can be prevented.

In the second method of manufacturing a semiconductor device, the following preferred embodiments can be adopted:

In the second step, the thickness of the etching stopper film is preferably determined in consideration of an amount of over-etch in the seventh step, so that the step portion having a level difference with a predetermined size or more is exposed in the fifth step.

The method can further comprise, after completing the eighth step, a step of silicifying at least an area in the vicinity of the surface of the source/drain region.

The third method of manufacturing a semiconductor device of this invention comprises a first step of forming a gate insulating film on a semiconductor substrate; a second step of depositing a first conductive film to be formed into a gate electrode on the gate insulating film; a third step of forming a trench by exposing a portion of the first conductive film where a trench isolation is to be formed and etching the semiconductor substrate in the exposed portion; a fourth step of depositing an insulating film for isolation on an entire top surface of the substrate, flattening the substrate at least until a surface of the first conductive film is exposed, and forming the trench isolation in the trench so as to surround a transistor region; a fifth step of depositing a second conductive film to be formed into at least an upper gate electrode on the entire top surface of the flattened substrate; a sixth step of making the first and second conductive films into a pattern at least of the gate electrode and exposing a step portion between the transistor region and the trench isolation; a seventh step of depositing an insulating film for sidewalls on the entire top surface of the substrate and anisotropically etching the insulating film for the sidewalls, so as to form electrode sidewalls and a step sidewall on side surfaces of the gate electrode and the step portion, respectively; and an eighth step of introducing an impurity into the semiconductor substrate in the transistor region on both sides of the gate electrode, so as to form source/drain regions.

When this method is adopted, the same effects as those attained by the second method of manufacturing a semiconductor device can be attained. In addition, in the patterning process for the gate electrode, the top surface of the substrate is completely flat, and hence, the patterning accuracy for the gate electrode can be improved.

BRIEF DESCRIPTION OF THE DRAWINGS

FIG. 12 is a sectional view for showing the structure of a semiconductor device of Embodiment 8;

FIGS. 13(a) through 13(e) are sectional views for showing manufacturing procedures for the semiconductor device of Embodiment 8;

FIGS. 15(a) through 15(f) are sectional views for showing manufacturing procedures for a semiconductor device of Embodiment 10;

DETAILED DESCRIPTION OF THE INVENTION (Embodiment 1)

Embodiment 1 of the invention will now be described referring to FIG. 1(a) through 1(d) and 2(a) through 2(e). In the manufacturing procedures of this embodiment, a connection hole for connecting an interconnection layer and a silicon substrate is designed to stretch over an active area and an isolation when alignment shift is not caused in photolithography.

In this embodiment, the isolation is formed as a trench isolation. Furthermore, interconnection to be formed above is assumed to be local interconnection in which an insulating film can be comparatively thin, but the embodiment is applicable also to general global interconnection formed on a thick interlayer insulating film.

Figure 1A:
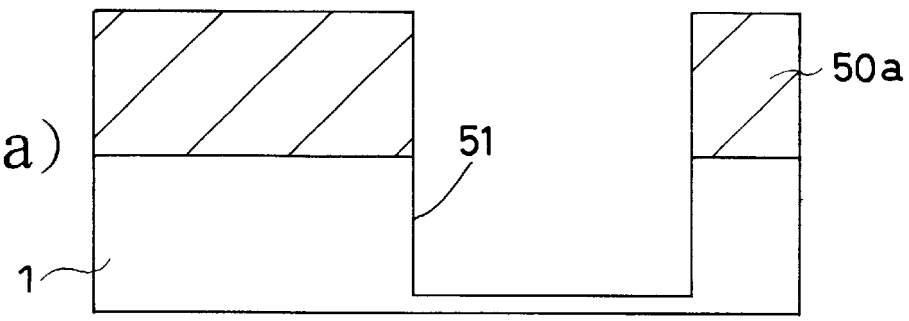
FIGS. 1(a) through 1(d) are sectional views for showing manufacturing procedures of Embodiment 1 up to the formation of an isolation.

First, as is shown in FIG. 1(a), a resist film 50a having a predetermined pattern is formed on a p-type silicon substrate 1 (or a p-type well). The silicon substrate 1 is dry-etched by using the resist film 50a as a mask, thereby forming a trench 51 with a depth of 1 $\mu$m.

Figure 1B:
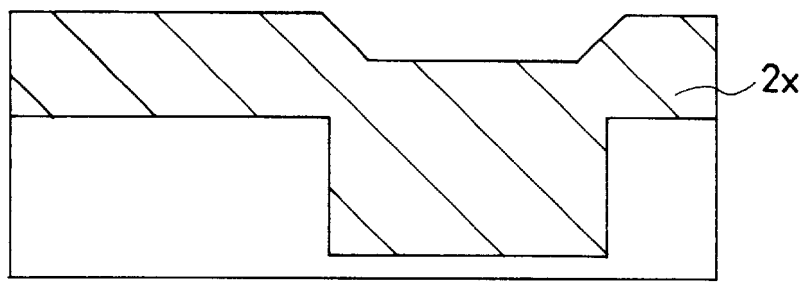

Then, as is shown in FIG. 1(b), the resist film 50a is removed, and then a silicon oxide film 2x is deposited on the entire top surface of the silicon substrate 1. Through this procedure, the previously formed trench 51 is filled with the silicon oxide film 2x.

Figure 1C:
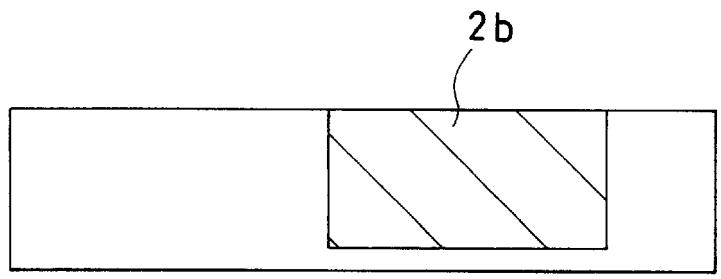

Next, as is shown in FIG. 1(c), the silicon oxide film 2x on the silicon substrate 1 is removed by, for example, a CMP (chemical mechanical polishing) method or etch-back through dry etching using a resist film, and at the same time, a trench isolation 2b is formed. At this point, the top surface of the silicon substrate 1 and the top surface of the isolation 2b are flattened with no level difference therebetween.

Figure 1D:
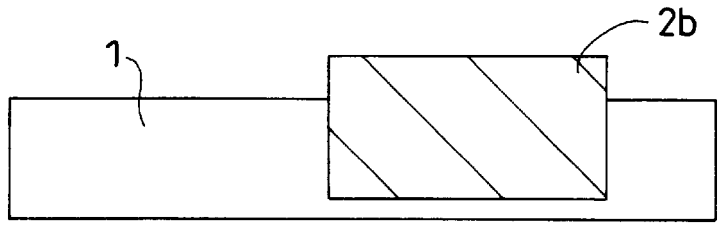

Then, as is shown in FIG. 1(d), dry etching with high etch selectivity is conducted so as to etch the silicon substrate 1 alone by a thickness of 0.2 $\mu$m. Thus, a step portion which is higher in a stepwise manner than the top surface of the silicon substrate 1 by 0.2 $\mu$m is formed in the isolation 2b. The level difference caused by the step portion is required to be sufficiently large in consideration of an amount of overetch in etching a subsequently formed insulating film 12, and hence, the level difference is preferably equal to or larger than the thickness of the insulating film 12.

It is noted that the method of causing the level difference between the top surface of the isolation 2b and the surface of the active area is not limited to that described above. For example, the level difference can be caused as follows: After an etching stopper film having a thickness corresponding to the level difference is previously deposited on the silicon substrate, a trench is formed and an insulating film for the trench isolation is deposited. Then, the entire top surface of the substrate is flattened by the CMP method or the like, and the etching stopper film is subsequently removed.

Figure 2A:
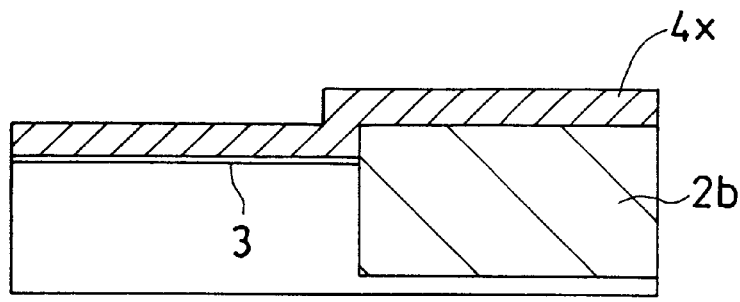
FIGS. 2(a) through 2(e) are sectional views for showing the manufacturing procedures of Embodiment 1 after the formation of the isolation.

Next, As is shown in FIG. 2(a), after forming a gate oxide film 3 on the silicon substrate 1, a polysilicon film 4x is deposited on the entire top surface of the substrate.

Figure 2B:
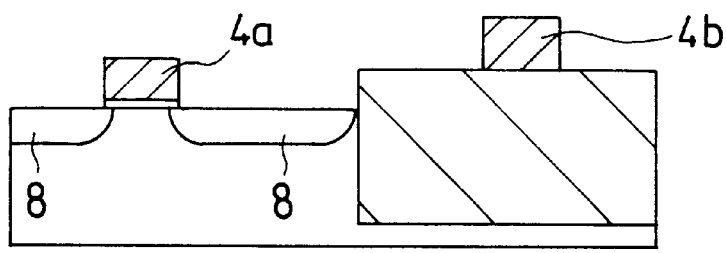

Then, as is shown in FIG. 2(b), after forming a resist film (not shown) having a predetermined pattern on the polysilicon film 4x, dry etching is conducted so as to form a polysilicon electrode 4a on the active area and a polysilicon interconnection 4b on the isolation 2b. Then, by using the gate electrode 4a as a mask, n-type impurity ions are injected at a high concentration, thereby forming high-concentration source/drain regions 8 in the silicon substrate 1 on both sides of the polysilicon electrode 4a.

Figure 2C:
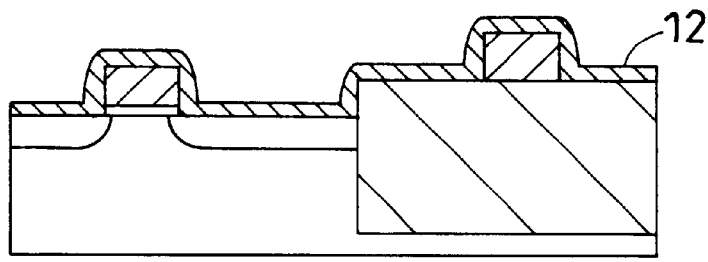

After this, as is shown in FIG. 2(c), the insulating film 12 having a thickness of, for example, 0.15 μm is deposited, so that an interconnection subsequently formed above the insulating film (i.e., the local interconnection in this embodiment) can be electrically insulated from the polysilicon electrode, the polysilicon interconnection and the active area.

Figure 2D:
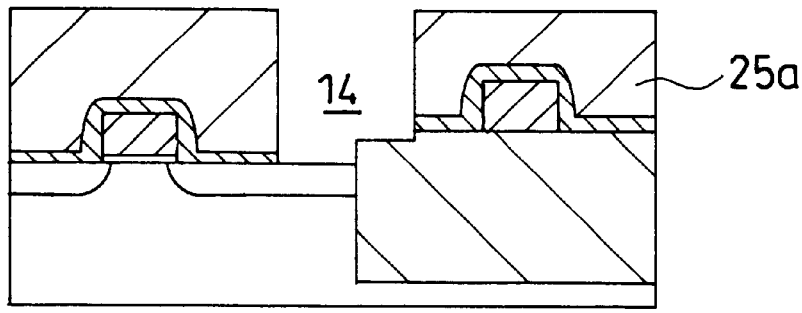

Next, as is shown in FIG. 2(d), a resist film 25a having a pattern for forming a connection hole is formed on the insulating film 12. At this point, the exposing area of the resist film 25a is positioned without an alignment margin for preventing interference with the isolation 2b. In this embodiment, after the resist film 25a is formed so that the exposing area stretches over the source/drain region 8, that is, the active area of a transistor, and the isolation 2b, dry etching is conducted by using the resist film 25a as a mask, thereby forming a connection hole 14 by removing the insulating film 12 in the exposing area of the resist film 25a. At this point, when the insulating film 12 is, for example, 40% over-etched than its thickness of 0.15 μm in order to ensure the formation of the connection hole 14, the isolation 2b in the exposing area of the resist film 25a is etched by a thickness of approximately 0.06 μm. However, in this embodiment, the step portion has a height of 0.2 μm, which is sufficiently larger than this etched amount, and hence, a recess where the top surface of the isolation 2b is lower than the top surface of the silicon substrate 1 is never formed in any part of the connection hole 14.

Figure 2E:
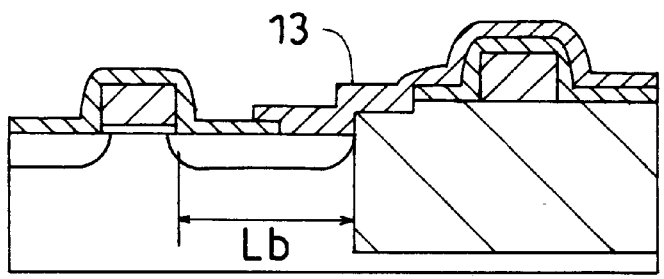

Next, as is shown in FIG. 2(e), a polysilicon film is deposited on the entire top surface and is patterned, thereby forming the local interconnection 13. At this point, the local interconnection 13 is also formed within the connection hole 14, so as to be electrically connected with the source/drain region 8 serving as the active area.

In a semiconductor device formed in the aforementioned procedures, the top surface of the isolation 2b is higher in a stepwise manner than the surface of the active area. Therefore, even when the isolation 2b is removed by some amount by the over-etch in dry etching the insulating film 12, the isolation 2b is prevented from being etched by a thickness exceeding the level difference caused by the step portion. Accordingly, when mask alignment is shifted in the photolithography, a recess with a depth reaching a certain depth of the source/drain region 8 is prevented from being formed in the connection hole 14. As a result, the conventional problems, that is, the degradation of the junction voltage resistance and the increase of the junction leakage current caused because of the low impurity concentration at a lower part of the active area of the silicon substrate corresponding to the sidewall of the recess, can be effectively prevented.

However, the level difference between the top surface of the isolation 2b and the surface of the active area is not necessarily required to be larger than the thickness of the insulating film 12. The dimensions and materials of the respective components can be determined so as to satisfy the following inequality (1), wherein "a" denotes the thickness of the insulating film 12; "b" denotes the level difference between the top surface of the isolation 2b and the surface of the active area; "ER1" denotes the etching rate of the insulating film 12; "ER2" denotes the etching rate of the isolation 2b; "D" denotes the depth of an impurity diffused layer in the active area; and "OE" denotes the over-etch ratio of the insulating film 12 in the formation of the connection hole 14.

$$OE \times a \times (ER2/ER1) \geq b + D \times (2/10) \quad (1)$$

Figure 18A:
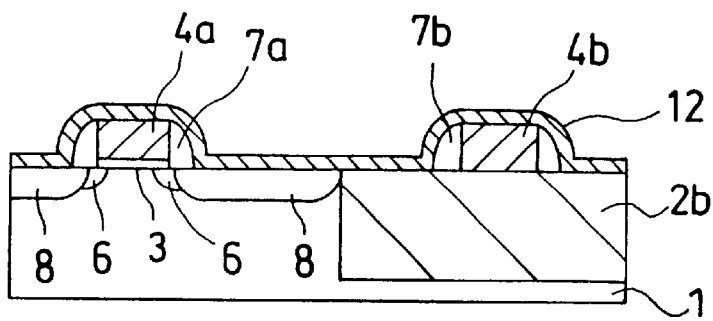
FIGS. 18(a) through 18(c) are sectional views for showing manufacturing procedures for the conventional semiconductor device of FIG. 17.
Figure 18B:
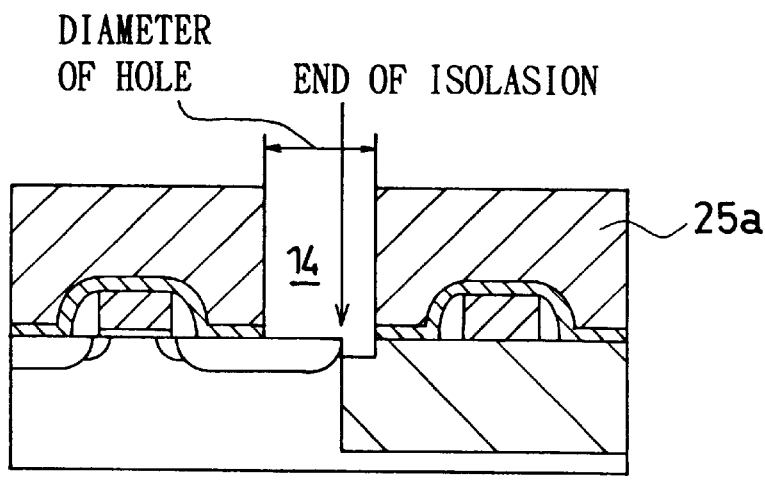
Figure 18C:
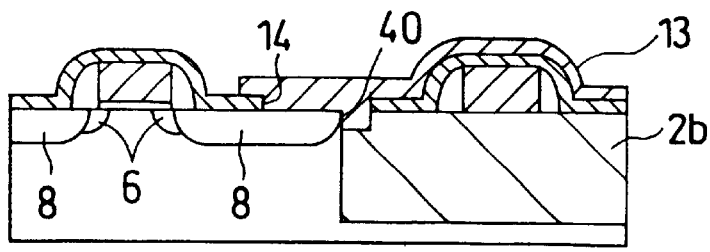
Figure 19:
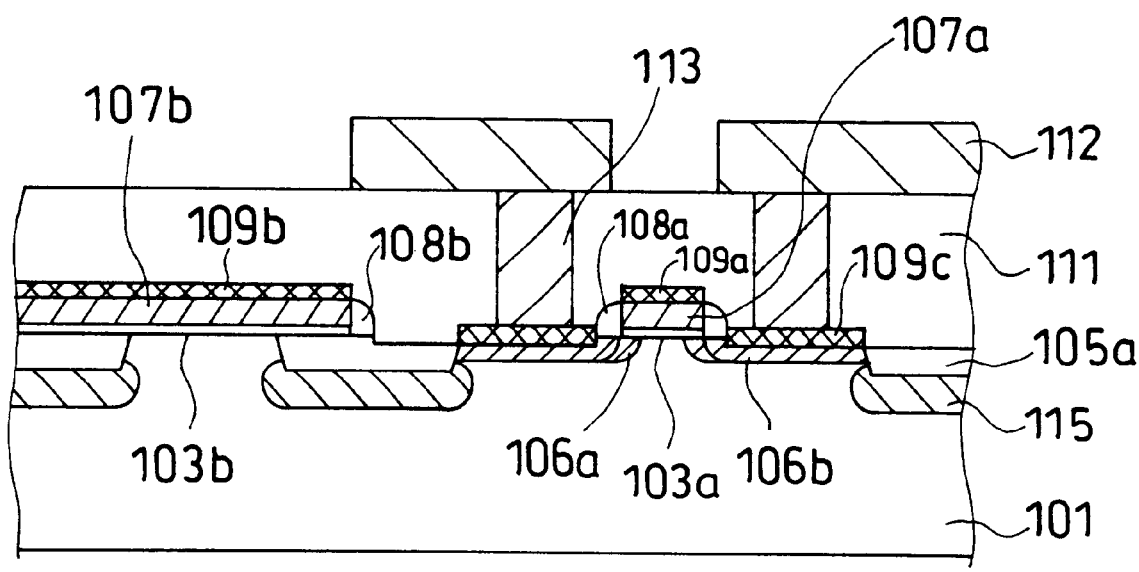
FIG. 19 is a sectional view of a conventional semiconductor device having a salicide structure and a trench isolation structure.
Figure 20A:
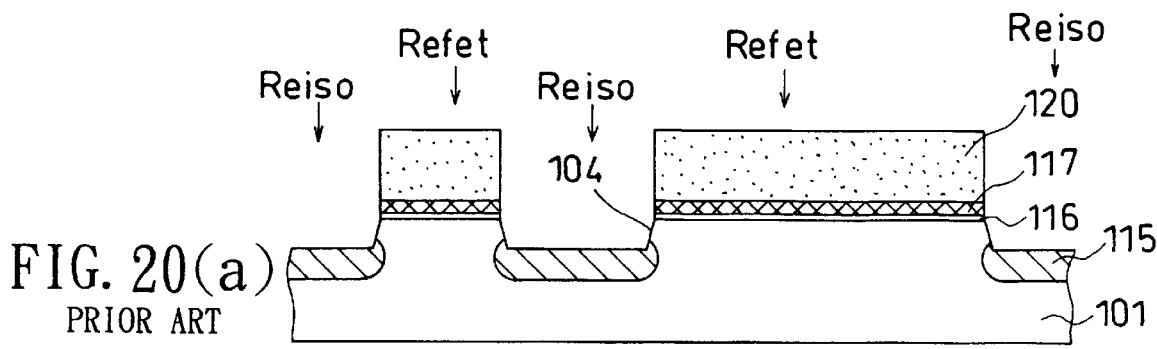
FIGS. 20(a) through 20(e) are sectional views for showing manufacturing procedures for the conventional semiconductor device of FIG. 19.
Figure 20B:
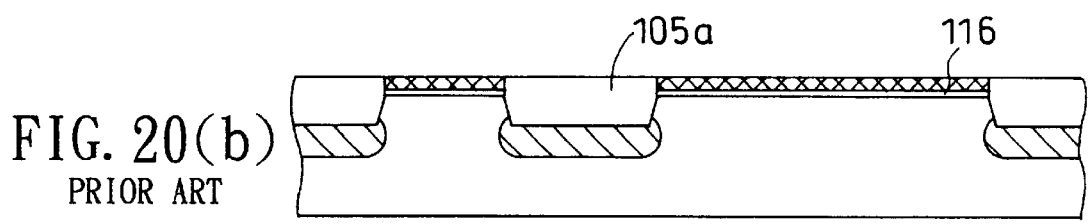
Figure 20C:
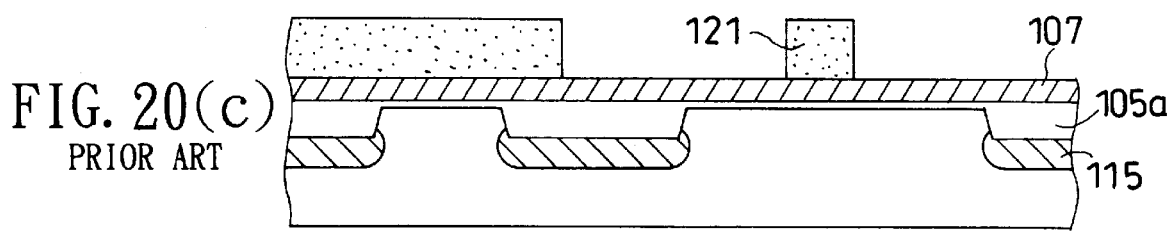
Figure 20D:
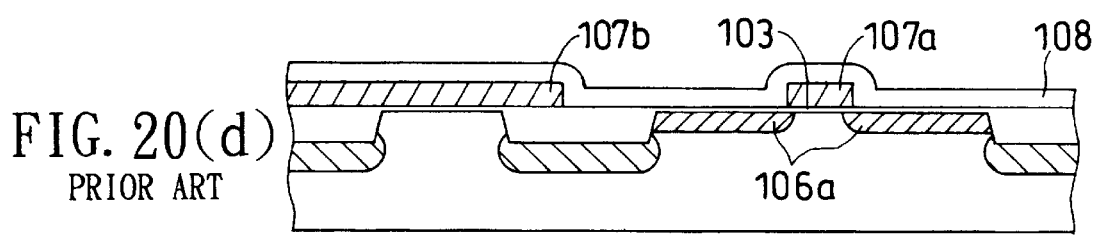
Figure 20E:
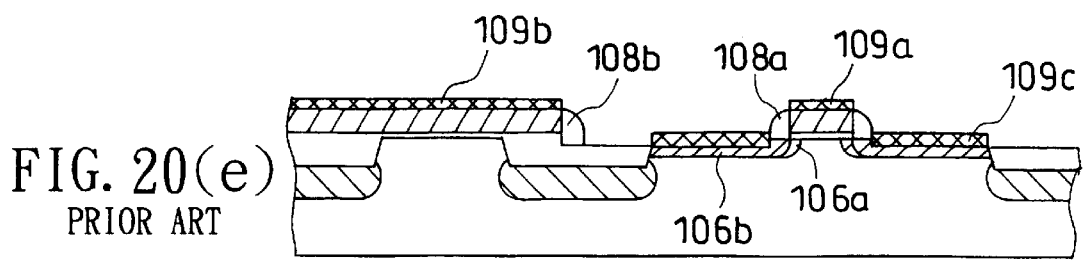

As far as the inequality (1) is satisfied, even when a part of the isolation 2b is removed to be at a lower level than the surface of the silicon substrate in the active area through the formation of the connection hole 14, so that the recess 40 as is shown in FIG. 18(c) is formed in a part of the connection hole 14, the bottom of the recess 40 is prevented from reaching the depth where the impurity concentration is low.

Figure 17:
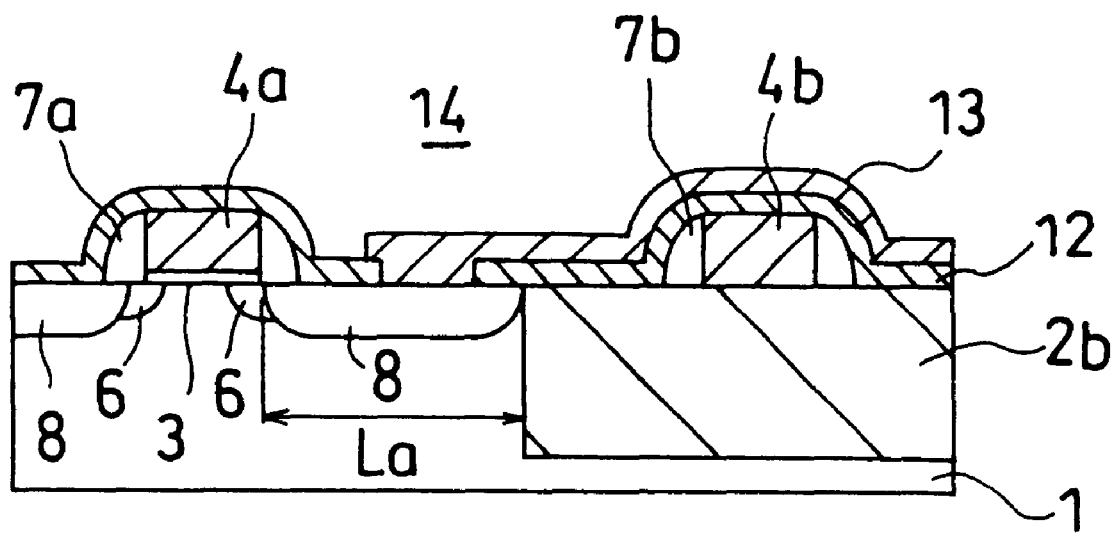
FIG. 17 is a sectional view of a conventional semiconductor device in which the surfaces of an active area and a trench isolation are placed at the same level.

Since the alignment margin in view of the mask shift in the photolithography can be omitted, the following effects can be attained: When a distance Lb between the polysilicon electrode 4a serving as the gate electrode and the isolation 2b is estimated as an index of the integration, the distance Lb is 0.8 μm, namely, the sum of the diameter of the connection hole, 0.5 μm, and the alignment margin from the gate electrode, 0.3 μm. Thus, the distance Lb can be decreased by 0.4 μm as compared with the conventional distance La of 1.2 μm (shown in FIG. 17).

(Embodiment 2)

Embodiment 2 will now be described referring to FIGS. 3(a) through 3(f). In this embodiment, a connection hole for connecting an interconnection layer and a silicon substrate is formed so as to stretch over an active area and an isolation in the same manner as in Embodiment 1, and a step portion between the isolation and the active area is provided with a sidewall.

Figure 3A:
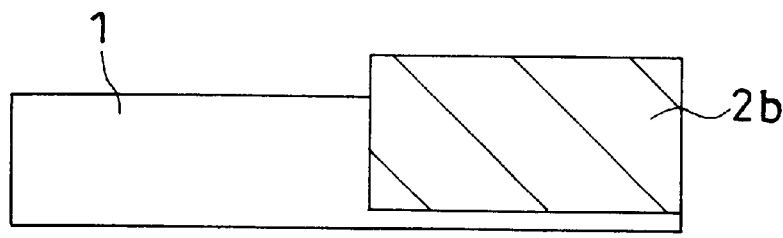
FIGS. 3(a) through 3(f) are sectional views for showing manufacturing procedures of Embodiment 2 after the formation of an isolation.
Figure 3B:
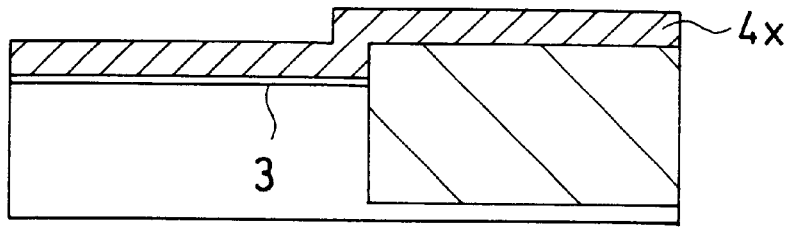

First, as is shown in FIGS. 3(a) and 3(b), an isolation 2b whose top surface is higher in a stepwise manner than the surface of an active area by a predetermined level difference and a gate oxide film 3 are formed on a silicon substrate 1 in the same manner as described in Embodiment 1. Then, a polysilicon film 4x is deposited on the entire top surface.

Next, the polysilicon film 4x is patterned, thereby forming a polysilicon electrode 4a and a polysilicon interconnection 4b. The procedures conducted so far are identical to those adopted in Embodiment 1. Then, a silicon oxide film is deposited on the entire top surface and is subjected to anisotropic etching, thereby forming electrode sidewalls 7a on both side surfaces of the polysilicon electrode 4a and interconnection sidewalls 7b on both side surfaces of the polysilicon interconnection 4b. At the same time, a step sidewall 7c is formed on the side surface of the step portion between the isolation 2b and the active area. Each of the sidewalls has a width of, for example, approximately 0.1 μm. After forming the polysilicon electrode 4a, an n-type impurity with a low concentration is ion-injected into the active area, so as to form a low-concentration source/drain region 6. After forming the electrode sidewalls 7a, an n-type impurity with a high concentration is ion-injected into the active area, so as to form a high-concentration source/drain region 8. This is a generally adopted method of manufacturing a MOSFET having the so-called LDD structure.

Figure 3C:
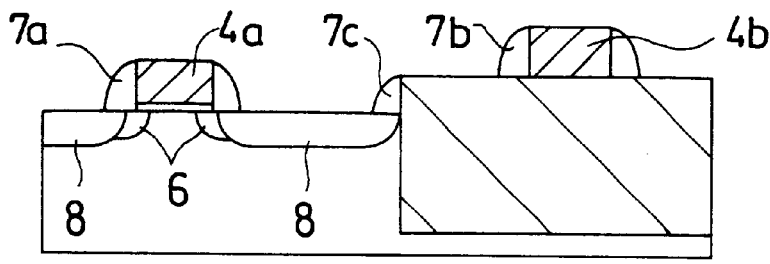
Figure 3D:
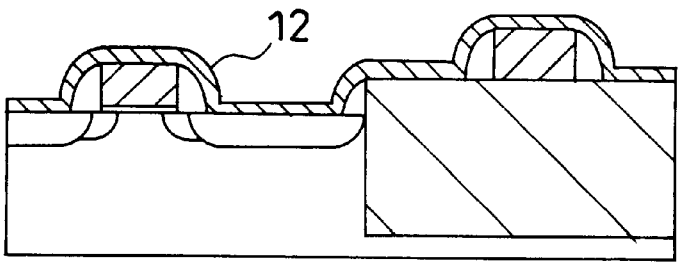
Figure 3E:
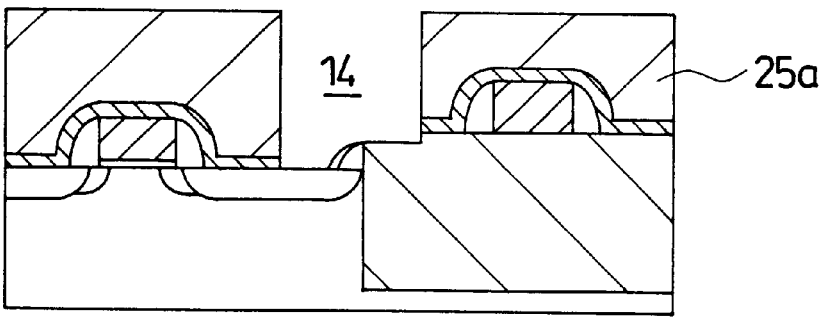
Figure 3F:
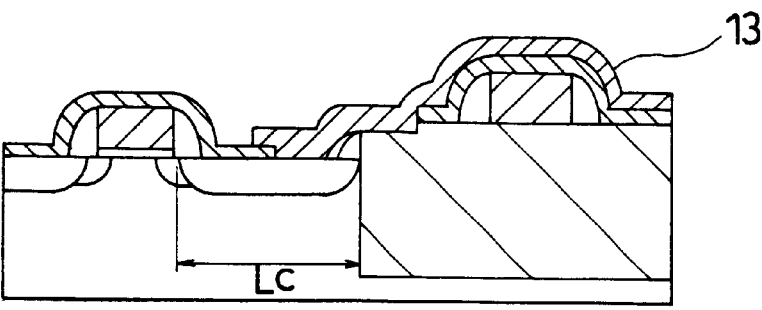

Then, as is shown in FIGS. 3(d) through 3(f), the procedures as described in Embodiment 1 referring to FIGS. 2(c) through 2(e) are conducted, thereby forming an insulating film 12 and a local interconnection 13 thereon.

This embodiment can achieve the effect to improve the integration similarly to Embodiment 1. In addition, owing to the step sidewall 7c, the abrupt level difference between the isolation 2b and the active area can be released. As a result, the amount of residue generated in the formation of the local interconnection 13 by patterning the polysilicon film can be advantageously decreased, and disconnection of the local interconnection 13 and resistance increase thereof can also be prevented.

At this point, a distance Lc between the polysilicon electrode 4a serving as a gate electrode and the isolation 2b is estimated as an index of the integration. The distance Lc is 1.0 µm, namely, the sum of the diameter of the connection hole, 0.5 µm, the width of the electrode sidewall 7a, 0.1 µm, the alignment margin from the polysilicon electrode 4a, 0.3 µm, and the width of the step sidewall 7c, 0.1 µm. Thus, the distance Lc can be decreased by 0.2 µm as compared with the conventional distance La of 1.2 µm (shown in FIG. 17).

(Embodiment 3)

Embodiment 3 will now be described referring to FIGS. 4(a) through 4(c).

In manufacturing procedures described in this embodiment, a connection hole is formed so as to stretch over an active area and an isolation only when mask alignment shift is caused in the photolithography.

Figure 4A:
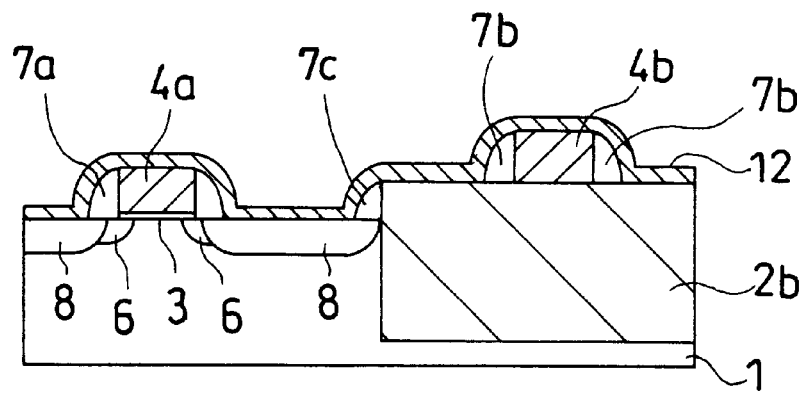
FIGS. 4(a) through 4(c) are sectional views for showing manufacturing procedures of Embodiment 3.

FIG. 4(a) shows a state where the procedures described in Embodiment 2 referring to FIGS. 3(a) through 3(d) have been completed. Specifically, as is shown in FIG. 4(a), after an isolation 2b with a top surface higher in a stepwise manner than the surface of an active area, a step sidewall 7c on the side surface of the step portion of the isolation 2b, a gate oxide film 3, a polysilicon electrode 4a serving as a gate electrode, electrode sidewalls 7a on both side surfaces of the polysilicon electrode 4a, a low-concentration source/drain region 6, a high-concentration source/drain region 8, a polysilicon interconnection 4b on the isolation 2b, and interconnection sidewalls 7b on both side surfaces of the polysilicon interconnection 4b are formed, an insulating film 12 with a thickness of approximately 0.15 µm is formed on the entire top surface.

Figure 4B:
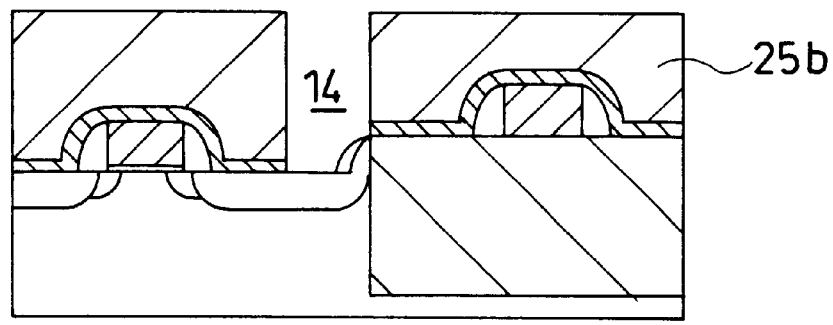

Next, as is shown in FIG. 4(b), a resist film 25b for forming a connection hole is formed. At this point, in this embodiment, the resist film 25b is formed so that the connection hole stretches over the active area (i.e., the high-concentration source/drain region 8) and the step sidewall 7c when the mask alignment shift is not caused in the lithography. Then, the insulating film 12 is etched, thereby forming the connection hole 14 stretching over the active area and the step sidewall 7c.

Figure 4C:
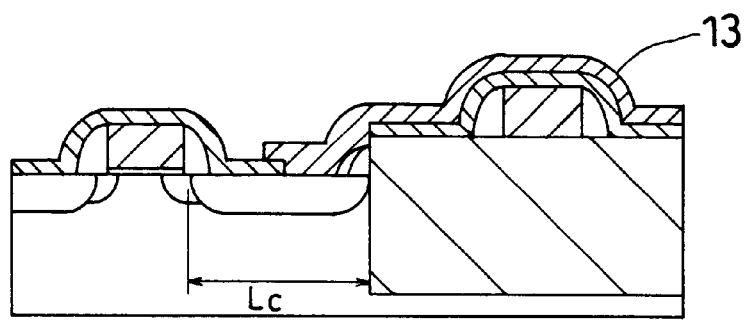

Then, as is shown in FIG. 4(c), a local interconnection 13 to be connected with the high-concentration source/drain region 8 is formed on the insulating film 12.

In the state shown in FIG. 4(b), the edge of the connection hole 14 can be shifted toward the isolation 2b by a maximum of 0.3 µm due to the mask alignment shift in the lithography. In such a case, the resultant structure becomes that described in Embodiment 2 (shown in FIG. 3(e)). However, no recess is formed in the isolation 2b within the connection hole 14 as described in Embodiments 1 and 2 even in such a case. Alternatively, even if a recess is formed, the problems of the degradation of the junction voltage resistance and the increase of the junction leakage current can be avoided as far as the dimensions and the like of the respective components are determined so as to satisfy the inequality (1).

Also in this embodiment, a distance Lc between the polysilicon electrode 4a and the isolation 2b is estimated as an index of the integration. Similarly to Embodiment 2, the distance Lc is 1.0 µm, namely, the sum of the diameter of the connection hole, 0.5 µm, the width of the electrode sidewall 7a, 0.1 µm, the alignment margin from the polysilicon electrode 4a, 0.3 µm, and the width of the step sidewall 7c, 0.1 µm. Thus, the distance Lc can be decreased by 0.2 µm as compared with the conventional distance La of 1.2 µm.

(Embodiment 4)

Embodiment 4 will now be described referring to FIGS. 5(a) through 5(c). In manufacturing procedures described in this embodiment, a connection hole for connecting an interconnection layer and a silicon substrate is formed so as to stretch over an active area and a polysilicon interconnection on an isolation.

Figure 5A:
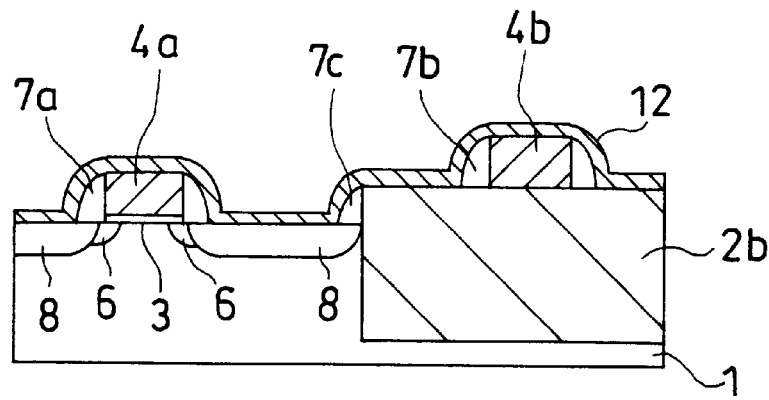
FIGS. 5(a) through 5(c) are sectional views for showing manufacturing procedures of Embodiment 4.

FIG. 5(a) shows the state where the procedures described in Embodiment 2 referring to FIGS. 3(a) through 3(d) have been completed. Specifically, as is shown in FIG. 5(a), after an isolation 2b with a top surface higher in a stepwise manner than the surface of the active area, a step sidewall 7c on the side surface of the step portion of the isolation 2b, a gate oxide film 3, a polysilicon electrode 4a serving as a gate electrode, electrode sidewalls 7a on both side surfaces of the polysilicon electrode 4a, a low-concentration source/drain region 6, a high-concentration source/drain region 8, a polysilicon interconnection 4b on the isolation 2b, and interconnection sidewalls 7b on both side surfaces of the polysilicon interconnection 4b are formed, an insulating film 12 with a thickness of approximately 0.15 µm is formed on the entire top surface.

Figure 5B:
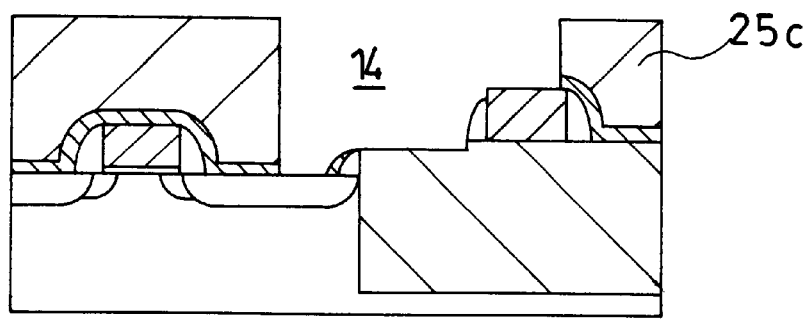

Next, as is shown in FIG. 5(b), a resist film 25c for forming a connection hole is formed. In this embodiment, the resist film 25c is formed with its exposing area stretching over the active area (i.e., the high-concentration source/drain region 8) and the polysilicon interconnection 4b on the isolation 2b when the mask alignment shift is not caused in the lithography. Then, the insulating film 12 is etched, thereby forming the connection hole 14 stretching over the high-concentration source/drain region 8, the isolation 2b and the polysilicon interconnection 4b.

Figure 5C:
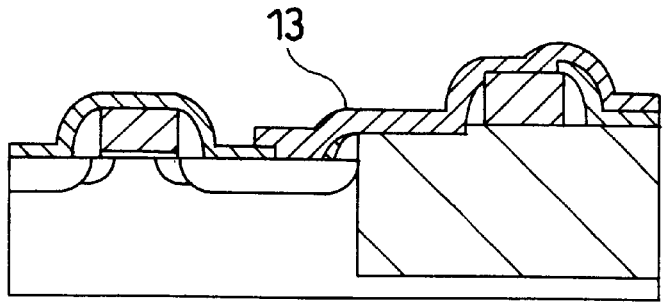

Then, as is shown in FIG. 5(c), a local interconnection 13 to be connected with the high-concentration source/drain region 8 and the polysilicon interconnection 4b is formed on the insulating film 12.

When the high-concentration source/drain region 8 is to be electrically connected with the polysilicon interconnection 4b serving as a gate interconnection formed on the isolation 2b in the conventional manufacturing procedures, a connection hole formed on the high-concentration source/drain region 8 and another connection hole formed on the polysilicon interconnection 4b are required to be positioned in consideration of alignment margins from the boundaries with the high-concentration source/drain region 8 and the isolation 2b, respectively. In contrast, in this embodiment, the interconnection member can be connected with the high-concentration source/drain region 8 and the polysilicon electrode 4b through one connection hole 14 without consideration of the alignment margins. In addition, as described in Embodiments 1 through 3, the problems of the degradation of the junction voltage resistance and the increase of the junction leakage current can be prevented from being caused through the over-etch in etching the insulating film 12.

In this embodiment, the interconnection on the isolation 2b is made of a polysilicon film, but another conductive material or an interconnection on a layer different from the polysilicon electrode can be used instead.

(Embodiment 5)

Embodiment 5 will now be described referring to FIGS. 6(a) through 6(f). In manufacturing procedures described in this embodiment, a connection hole for connecting an interconnection layer and a silicon substrate is formed so as to stretch over an active area, a gate electrode and an isolation.

Figure 6A:
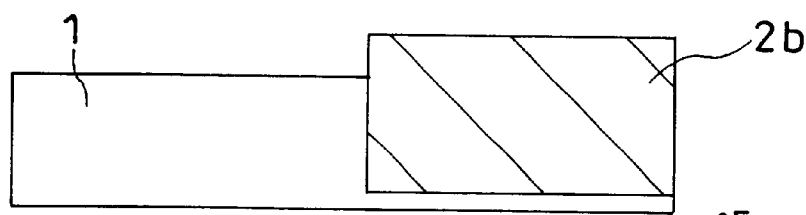
FIGS. 6(a) through 6(f) are sectional views for showing manufacturing procedures of Embodiment 5.

First, as is shown in FIG. 6(a), an isolation 2b with a top surface higher in a stepwise manner than the surface of a p-type silicon substrate 1 is formed.

Figure 6B:
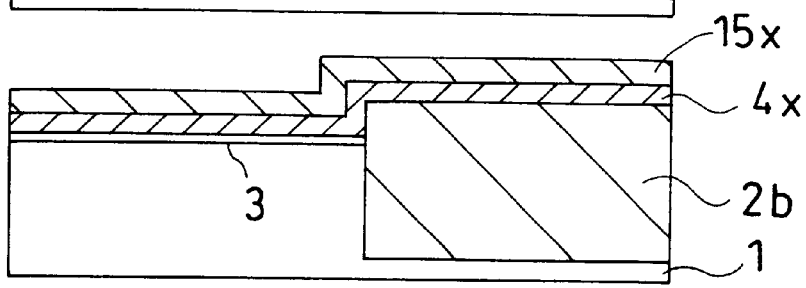

Next, as is shown in FIG. 6(b), a polysilicon film 4x with a thickness of 0.2 μm is deposited on the entire top surface, and a silicon oxide film 15x for gate protection with a thickness of approximately 0.15 μm is deposited on the polysilicon film 4x. At this point, the thickness of the silicon oxide film 15x for gate protection is required to be sufficiently large in consideration of an amount of over-etch to be removed in etching a subsequently formed insulating film 12. In this embodiment, the thickness of the silicon oxide film 15x is substantially the same as that of the insulating film 12.

Figure 6C:
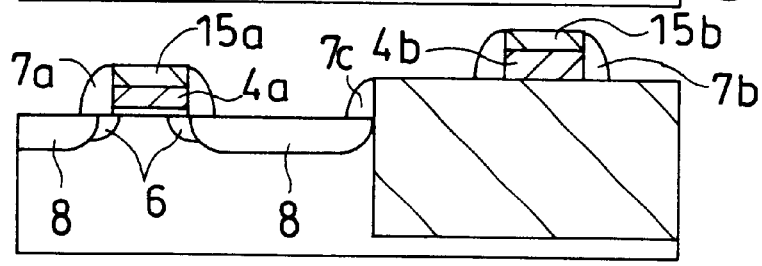
Figure 6D:
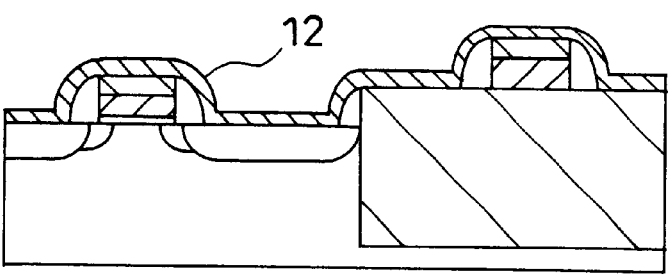

Then, as is shown in FIGS. 6(c) and 6(d), the procedures as described in Embodiment 2 referring to FIGS. 3(c) and 3(d) are conducted. Thus, after a polysilicon electrode 4a and a gate protection film 15a together serving as a gate electrode, electrode sidewalls 7a on both side surfaces of the polysilicon electrode 4a and the gate protection film 15a, a low-concentration source/drain region 6, a high-concentration source/drain region 8, a polysilicon interconnection 4b and an interconnection protection film 15b on the isolation 2b, interconnection sidewalls 7b on both side surfaces of the polysilicon interconnection 4b and the interconnection protection film 15b and a step sidewall 7c are formed, the insulating film 12 with a thickness of approximately 0.15 μm is formed on the entire top surface.

Figure 6E:
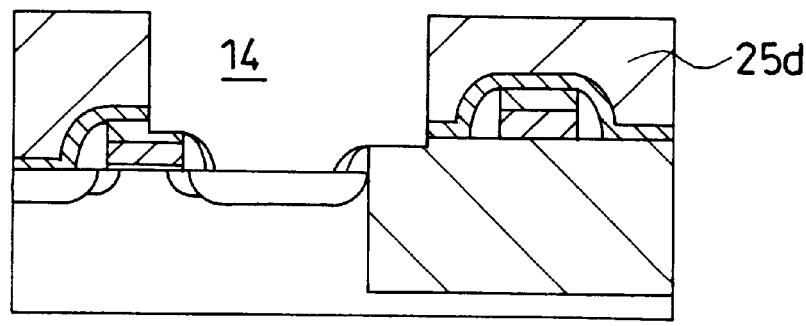

Next, as is shown in FIG. 6(e), a resist film 25d for forming a connection hole is formed. At this point, in this embodiment, the resist film 25d is formed so that the connection hole stretches over the polysilicon electrode 4a, the high-concentration source/drain region 8 serving as the active area and the isolation 2b when the mask alignment shift is not caused in the lithography. Accordingly, when the alignment shift is not caused, the exposing area of the resist film 25d stretches also over a part of the polysilicon electrode 4a. Then, the insulating film 12 is patterned by dry etching. At this point, a part of the isolation 2b and the gate protection film 15a in the exposing area of the resist film 25d are also removed by some amount by the over-etch in the dry etching of the insulating film 12. However, the connection hole 14 never reaches the polysilicon electrode 4a.

Figure 6F:
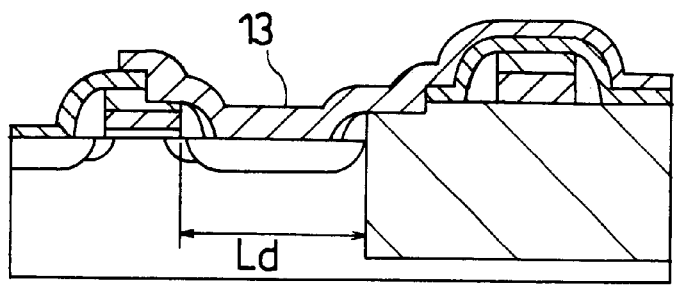

Then, as is shown in FIG. 6(f), a polysilicon film is deposited on the entire top surface and then patterned, thereby forming a local interconnection 13 to be connected with the high-concentration source/drain region 8.

In this embodiment, the problems of the degradation of the junction voltage resistance and the increase of the junction leakage current can be avoided as in the aforementioned embodiments even when the insulating film 12 is 40% over-etched than its thickness of 0.15 μm in order to form the connection hole 14.

In particular in this embodiment, the connection hole 14 stretches also over the polysilicon electrode 4a when the alignment shift is not caused in the lithography. Therefore, when the insulating film 12 is, for example, 40% over-etched than its thickness of 0.15 μm in the dry etching thereof, although a part of the gate protection film 15a is etched by a thickness of approximately 0.06 μm. However, the conventional problem of the electric short circuit with an interconnection on an upper layer through the connection hole can be avoided since the thickness of the gate protection film 15a is 0.15 μm, which is sufficiently larger than 0.06 μm.

It is noted that the thickness of the gate protection film 15a can be determined as follows: The dimensions and materials of the respective components are determined so as to satisfy the following inequality (2), wherein "a" denotes the thickness of the insulating film 12; "c" denotes the thickness of the gate protection film 4a, "ER1" denotes the etching rate of the insulating film 12; "ER3" denotes the etching rate of the gate protection film 4a; and "OE" denotes the over-etch ratio of the insulating film 12 in the formation of the connection hole 14:

$$OE \times a \times (ER3/ER1) < c \qquad (2)$$

At this point, a distance Ld between the polysilicon electrode 4a serving as the gate electrode and the isolation 2b is estimated as an index of the integration. The distance Ld is 0.7 μm, namely, the sum of the diameter of the connection hole, 0.5 μm, the width of the electrode sidewall 7a, 0.1 μm, and the width of the step sidewall 7c, 0.1 μm. Thus, the distance Ld can be decreased by 0.5 μm as compared with the conventional distance of 1.2 μm.

(Embodiment 6)

Embodiment 6 will now be described referring to FIGS. 7(a) through 7(c). In manufacturing procedures described in this embodiment, a connection hole for connecting an interconnection layer and a silicon substrate is formed so as to stretch over an active area, an electrode sidewall and an isolation when the alignment shift is not caused, and is formed so as to stretch also over a polysilicon electrode only when the alignment shift is caused.

Figure 7A:
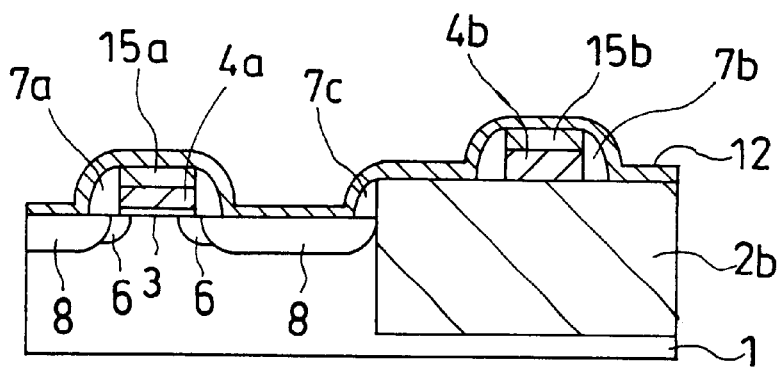
FIGS. 7(a) through 7(c) are sectional views for showing manufacturing procedures of Embodiment 6.

FIG. 7(a) shows the state where the procedures described in Embodiment 5 referring to FIGS. 6(a) through 6(d) have been completed. Specifically in FIG. 7(a), after an isolation 2b having a top surface higher in a stepwise manner than the surface of the active area, a step sidewall 7c on the side surface of the step portion of the isolation 2b, a gate oxide film 3, a polysilicon electrode 4a serving as a gate electrode, a gate protection film 15a on the polysilicon electrode 4a, electrode sidewalls 7a on both side surfaces of the polysilicon electrode 4a and the gate protection film 15a, a low-concentration source/drain region 6, a high-concentration source/drain region 8, a polysilicon interconnection 4b on the isolation 2b, an interconnection protection film 15b on the polysilicon interconnection 4b, and interconnection sidewalls 7b on both side surfaces of the polysilicon interconnection 4b and the interconnection protection film 15b are formed, an insulating film 12 having a thickness of approximately 0.15 μm is formed on the entire top surface.

Figure 7B:
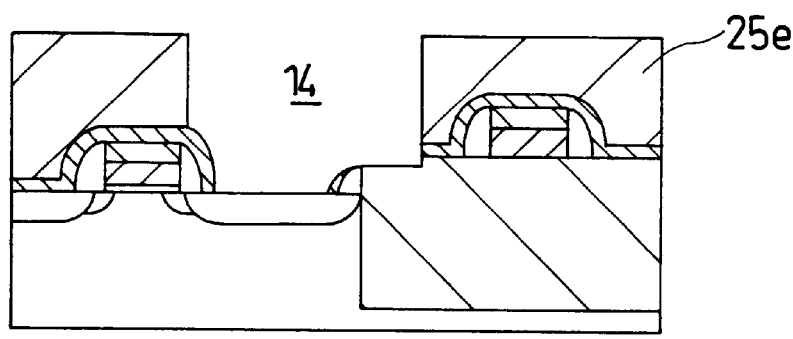
Figure 7C:
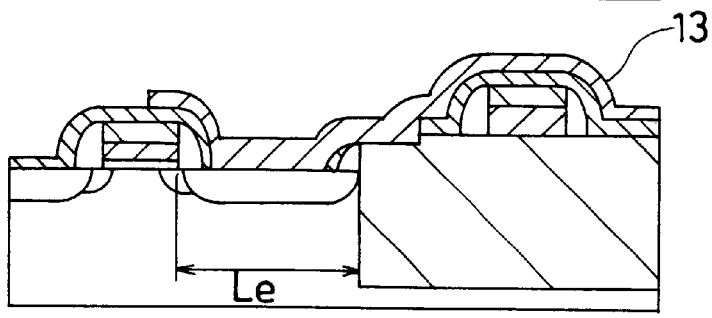

Next, as is shown in FIG. 7(b), a resist film 25e having a pattern for forming a connection hole is formed. At this point, in this embodiment, the resist film 25e is formed so that its exposing area can expose at least the step sidewall 7c and the high-concentration source/drain region 8 serving as the active area and stretches also over the electrode sidewall 7a.

Then, a polysilicon film is deposited on the entire top surface and patterned, thereby forming a local interconnection 13 to be connected with the high-concentration source/drain region 8.

In the procedure shown in FIG. 7(b) of this embodiment, when the exposing area of the resist film 25e is shifted by, for example, a maximum of 0.3 μm due to the alignment shift in the lithography, the connection hole 14 is formed so as to stretch also over a part of the polysilicon electrode 4a. When the exposing area of the resist film 25e is shifted in the reverse direction, the connection hole 14 is formed so as to stretch also over a part of the isolation 2b. However, in either case, the junction voltage at the edge of the isolation 2b is prevented from degrading and the junction leakage current is prevented from increasing as far as the dimensions and the like of the respective components are determined so as to satisfy the inequalities (1) and (2). In addition, an electrical short circuit between an interconnection member such as the local interconnection and the polysilicon electrode 4a can be avoided.

At this point, a distance Le between the polysilicon electrode 4a serving as the gate electrode and the isolation 2b is estimated as an index of the integration. Similarly to Embodiment 5, the distance Le is 0.7 μm, namely, the sum of the diameter of the connection hole, 0.5 μm, the width of the electrode sidewall 7a, 0.1 μm, and the width of the step sidewall 7c, 0.1 μm. Thus, the distance Le can be decreased by 0.5 μm as compared with the conventional distance of 1.2 μm.

In each of the aforementioned embodiments, the local interconnection is adopted as the interconnection member so as to make the insulating film 12 comparatively thin. However, each embodiment can be applied to an interconnection member using a general global interconnection formed with an interlayer insulating film sandwiched. When the global interconnection is adopted, the interlayer insulating film is comparatively thick. Therefore, the effects of the embodiments can be similarly attained by decreasing the over-etch ratio of the interlayer insulating film in the formation of the connection hole or by increasing the level difference between the top surface of the isolation and the surface of the active area. This will be described in more detail in Embodiment 7 below.

Furthermore, when the isolation 2b and the gate protection film 15a used in Embodiment 5 or 6 are made of a material having a smaller etching rate than the material for the insulating film 12 against the etching for forming the connection hole, the semiconductor device can be manufactured with more ease.

In addition, when the insulating film 12 in each of the aforementioned embodiments has a multilayered structure including at least one lower layer made of a material having a smaller etching rate against the etching for forming the connection hole, the semiconductor device can be manufactured with more ease.

(Embodiment 7)

Embodiment 7 will now be described in which an interconnection layer formed on a thick interlayer insulating film is connected with an active area of a semiconductor substrate through a contact hole formed on the interlayer insulating film.

Figure 8A:
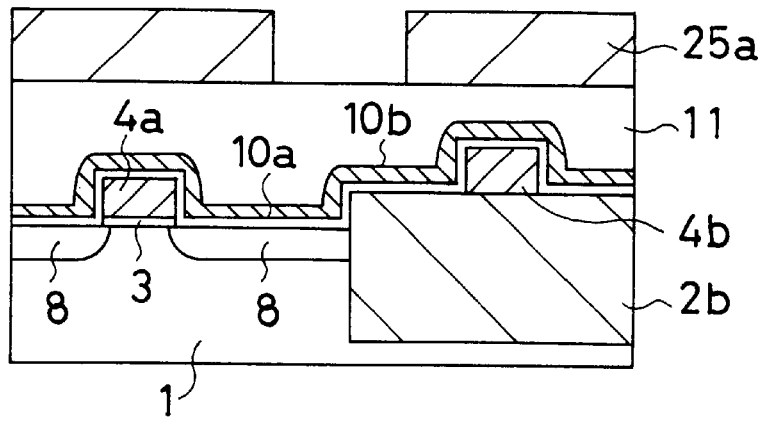
FIGS. 8(a) through 8(c) are sectional views for showing manufacturing procedures of Embodiment 7 in which a comparatively thin insulating film of Embodiment 1 is replaced with a layered film and an interlayer insulating film.
Figure 8B:
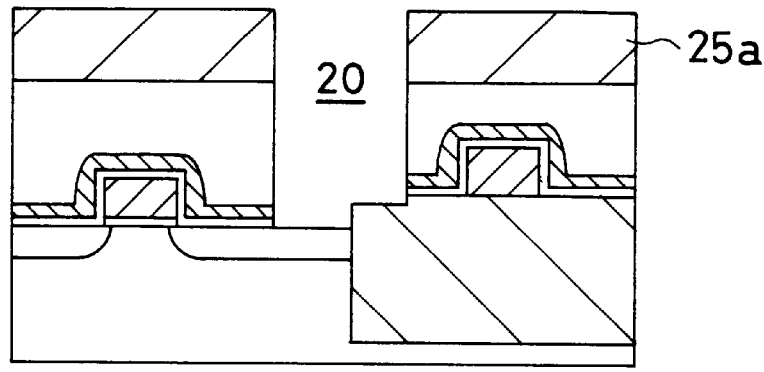
Figure 8C:
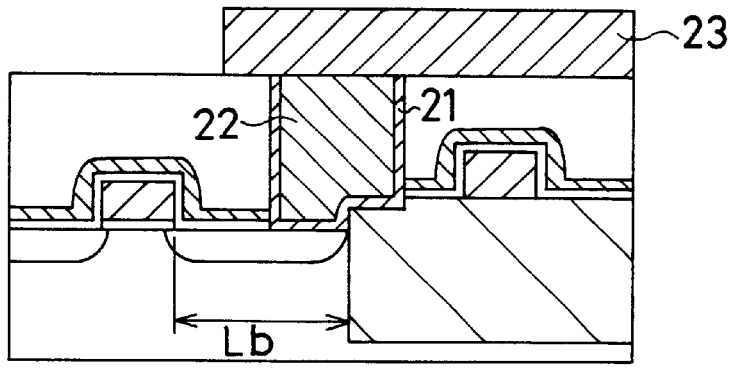

FIGS. 8(a) through 8(c) are sectional views for showing procedures for forming a layered film 10 and an interlayer insulating film 11 instead of the comparatively thin insulating film 12 of Embodiment 1. As is shown in FIG. 8(a), after conducting the procedures shown in FIGS. 1(a) through 1(d) and 2(a) through 2(c), a layered film 10 including a silicon oxide film 10a with a thickness of approximately 70 nm and a silicon nitride film 10b with a thickness of approximately 80 nm is formed on the entire top surface of the substrate. Then, an interlayer insulating film 11 of a silicon oxide film with a thickness of approximately 600 nm is deposited thereon. Next, a resist film 25a having a pattern for forming a contact hole is formed on the interlayer insulating film 11. At this point, the exposing area of the resist film 25a is positioned without an alignment margin for avoiding interference with an isolation 2b. In FIG. 8(a), the resist film 25a is formed so that the exposing area stretches over a source/drain region 8 serving as the active area of a transistor and the isolation 2b.

Next, as is shown in FIG. 8(b), etching is conducted by using the resist film 25a as a mask, thereby selectively removing the interlayer insulating 25a and the layered film 10. Thus, a contact hole 20 stretching over the isolation 2b and the active area is formed.

Then, as is shown in FIG. 8(c), a plug underlying film 21 made of a TiN/Ti film and a W plug 22 are deposited within the contact hole 20 by selective CVD. Furthermore, an aluminum alloy film is deposited on the entire top surface of the substrate and the aluminum alloy film is patterned, thereby forming a first layer metallic interconnection 23. At this point, the first layer metallic interconnection 23 is electrically connected with the source/drain region 8 serving as the active area through the W plug 22 and the plug underlying film 23 filled in the contact hole 20.

Figure 9A:
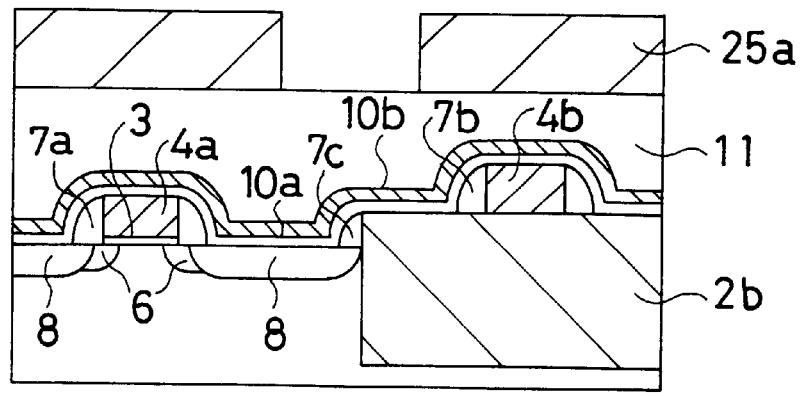
FIGS. 9(a) through 9(c) are sectional views for showing the manufacturing procedures of Embodiment 7 in which a comparatively thin insulating film of Embodiment 2 is replaced with a layered film and an interlayer insulating film.
Figure 9B:
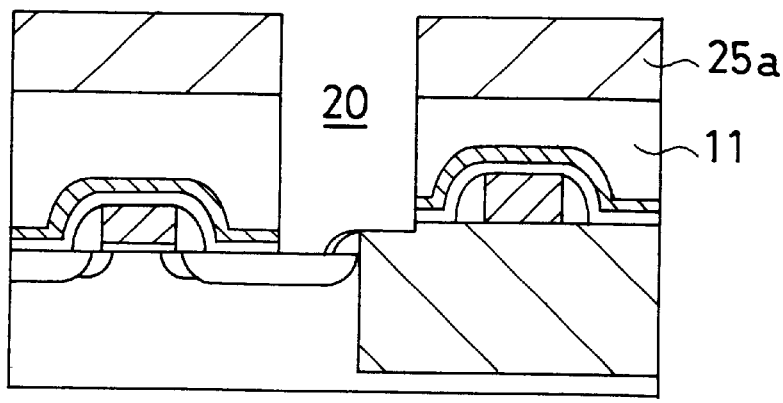
Figure 9C:
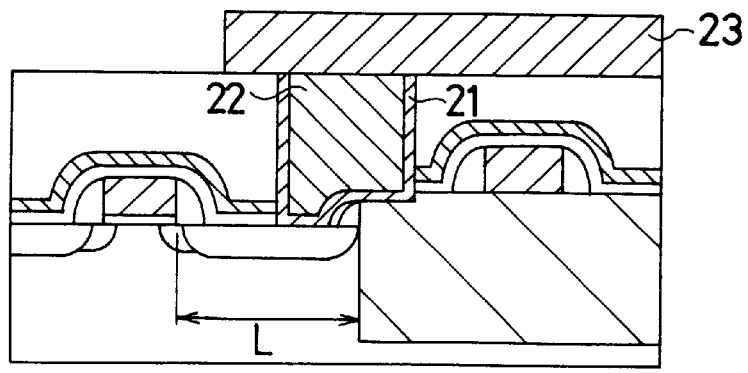

FIGS. 9(a) through 9(c) are sectional views for showing procedures for forming a layered film 10 and an interlayer insulating film 11 instead of the comparatively thin insulating film 12 of Embodiment 2. In these manufacturing procedures, a procedure for forming sidewalls 7a through 7c is added to the manufacturing procedures shown in FIGS. 8(a) through 8(c), so as to manufacture a transistor having the LDD structure.

Figure 10A:
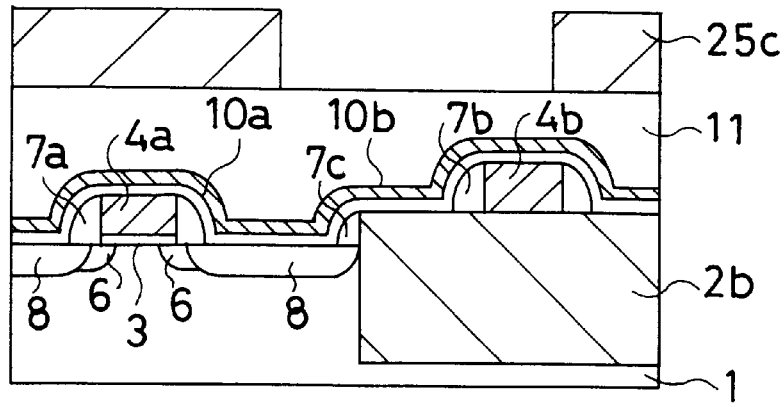
FIGS. 10(a) through 10(c) are sectional views for showing the manufacturing procedures of Embodiment 7 in which a comparatively thin insulating film of Embodiment 4 is replaced with a layered film and an interlayer insulating film.
Figure 10B:
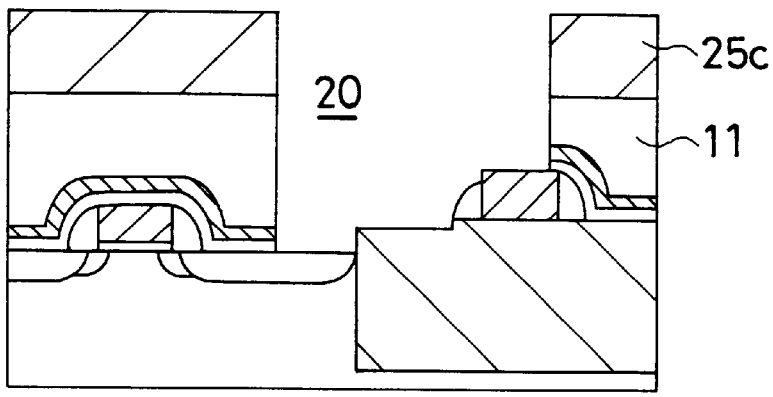
Figure 10C:
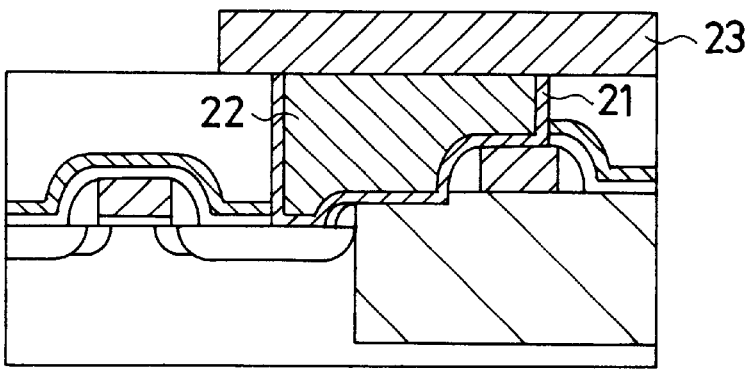

FIGS. 10(a) through 10(c) are sectional views for showing procedures for forming a layered film 10 and an interlayer insulating film 11 instead of the comparatively thin insulating film 12 of Embodiment 4. In the procedure shown in FIG. 10(a), a resist film 25c having its exposing area stretching over the active area and the gate interconnection 4b is formed on the interlayer insulating film 11. Thereafter, the same procedures as those shown in FIGS. 8(b) and 8(c) are conducted.

Figure 11A:
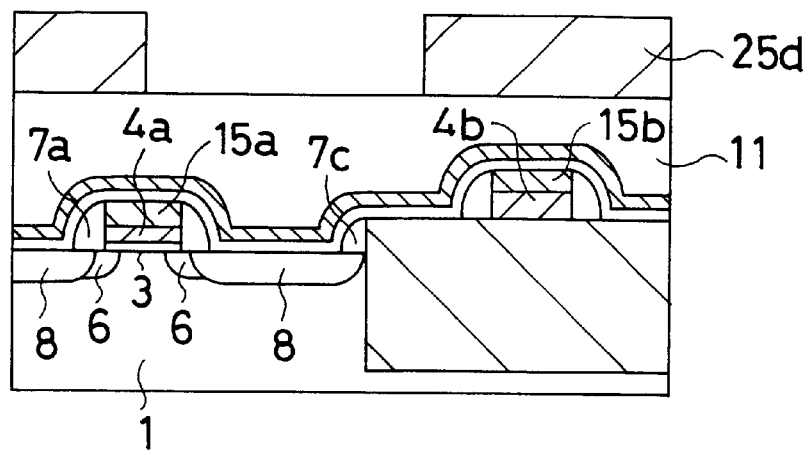
FIGS. 11(a) through 11(c) are sectional views for showing the manufacturing procedures of Embodiment 7 in which a comparatively thin insulating film of Embodiment 5 is replaced with a layered film and an interlayer insulating film.
Figure 11B:
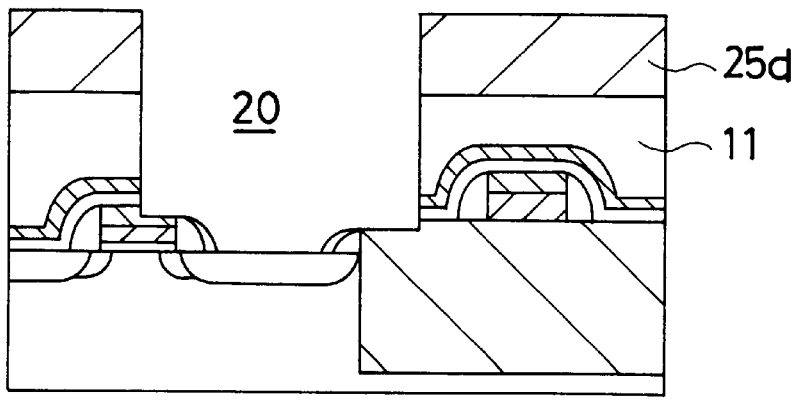
Figure 11C:
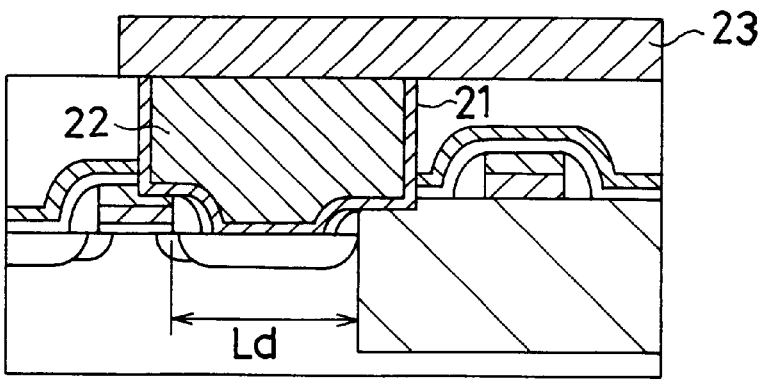

FIGS. 11(a) through 11(c) are sectional views for showing procedures for forming a layered film 10 and an interlayer insulating film 11 instead of the comparatively thin insulating film 12 of Embodiment 5. In the procedure shown in FIG. 11(a), a gate protection silicon oxide film 15a is formed on a gate electrode 4a, and the layered film 10 and the interlayer insulating film 11 are formed thereon. Then, a resist film 25d having its exposing area stretching over the isolation, the active area and the gate electrode 4a is formed on the interlayer insulating film 11. Thereafter, the same procedures as those shown in FIGS. 8(b) and 8(c) are conducted.

In each of the procedures shown in FIGS. 8(b), 9(b), 10(b) and 11(b), the silicon nitride film 10b having high etching selectivity against the silicon oxide film is formed below the interlayer insulating film 11. Therefore, the silicon nitride film 10b is prevented from being completely removed by the over-etch in etching the interlayer insulating film 11. When the silicon nitride film 10b is to be removed from the layered film 10, the silicon oxide film 10a is prevented from being completely removed since the etching selectivity between the silicon nitride film 10b and the silicon oxide film 10a below is high. Furthermore, since the silicon oxide film 10a has a thickness of approximately 70 nm, which is smaller than the level difference of 0.2 μm between the isolation and the active area, the isolation 2b is prevented from being etched to be lower than the surface of the active area by the over-etch in etching the silicon oxide film 10a. In other words, a recess where the top surface of the isolation 2b is lower than the surface of the silicon substrate is never formed in any part of the contact hole 20. Accordingly, in the formation of the contact hole for electrically connecting the interconnection layer formed on the interlayer insulating film and the active area of the semiconductor substrate, the same effects as those described in the aforementioned embodiments can be attained.

However, the underlying film below the interlayer insulating film can be omitted in this embodiment. Even when it is omitted, since the step portion is formed between the top surface of the isolation and the surface of the active area, the isolation cannot be etched to be lower than the surface of the active area in the formation of the contact hole. Thus, the degradation of the junction voltage resistance the increase of the junction leakage current can be prevented as much as possible.

(Embodiment 8)

Embodiment 8 will now be described referring to FIGS. 12 and 13(a) through 13(e). FIG. 12 is a sectional view showing the structure of a semiconductor device of this embodiment, and FIGS. 13(a) through 13(e) are sectional views for showing manufacturing procedures for the semiconductor device having the structure shown in FIG. 12.

As is shown in FIG. 12, in a silicon substrate (or well) 1 of one conductivity type, a trench isolation 2b is formed in an isolation region Reiso for partitioning an area in the vicinity of the surface of the silicon substrate 1 into a plurality of transistor regions Refet. The top surface of the isolation 2b is sufficiently higher than the surface of the silicon substrate 1 in each transistor region Refet, and a step portion with a predetermined level difference is formed between the isolation 2b and the transistor region Refet. This isolation 2b is formed by filling a trench formed in the silicon substrate 1 with an insulating material as described below. Furthermore, a channel stop region 60 of the same conductivity type as that of the silicon substrate 1 is formed at least below the isolation 2b.

In each transistor region Refet partitioned by the isolation 2b is formed a MOS transistor including a gate electrode 4a, a gate oxide film 3, electrode sidewalls 7a, a low-concentration source/drain region 6 and a high-concentration source/drain region 8. Also, on the silicon substrate 1 excluding the transistor regions Refet and on the isolation 2b, a gate interconnection 4b formed simultaneously with the gate electrode 4a and interconnection sidewalls 7b are formed. Furthermore, an upper gate electrode 9a, an upper gate interconnection 9b and a source/drain electrode 9c each made of titanium silicide ($TiSi_2$) are formed on the gate electrode 4a, the gate interconnection 4b and the high-concentration source/drain region 8, respectively.

This embodiment is characterized by a step sidewall 7c formed on the side surface of the step portion of the isolation 2b simultaneously with the electrode sidewalls 7a and the interconnection sidewalls 7b. A part of the step sidewall 7c is communicated with the electrode sidewalls 7a and the interconnection sidewalls 7b.

Furthermore, on the entire top surface of the substrate bearing the isolation 2b, the gate electrode 4a and the like, an interlayer insulating film 11 and a first layer metallic interconnection 23 are formed. The first layer metallic interconnection 23 is connected with the upper gate electrode 9a and the source/drain electrode 9c in the transistor region through a W plug 22.

Now, the manufacturing procedures for realizing the structure shown in FIG. 12 will be described referring to FIGS. 13(a) through 13(e).

First, as is shown in FIG. 13(a), a silicon oxide film 52 and a silicon nitride film 53 are deposited on a silicon substrate 1. Then, a resist film 50a for exposing the isolation regions Reiso and masking the transistor regions Refet is formed on the silicon nitride film 53. After this, etching is conducted by using the resist film 50a as a mask, so as to selectively remove the silicon nitride film 53 and the silicon oxide film 52 and further etch the silicon substrate 1, thereby forming a trench 51. At this point, differently from the conventional method of forming a trench, the silicon nitride film 53 has a thickness as large as approximately 150 through 200 nm. However, the silicon oxide film 52 has a thickness of 10 through 20 nm as in the conventional method. The depth of the trench 51 can be approximately 500 nm also as in the conventional method. Then, impurity ions of a conductivity type different from that of an impurity to be injected into a subsequently formed source/drain region are injected, thereby forming a channel stop region 60.

Next, as is shown in FIG. 13(b), after removing the resist film 50a, a silicon oxide film (not shown) is deposited so as to have a sufficient thickness larger than the sum of the depth of the trench 51 and the thickness of the remaining silicon nitride film 53, namely, the height from the bottom of the trench 51 to the top surface of the silicon nitride film 53. Then, the silicon oxide film is removed by the CMP method so as to expose the surface of the silicon nitride film 53, thereby flattening the entire top surface of the substrate. Through this procedure, a trench isolation 2b made of the silicon oxide film is formed in the isolation region Reiso. The flattening method to be adopted is not limited to that described above but the surface can be flattened by etch-back using a resist film having a reverse pattern to the pattern of the transistor region Refet.

Then, the silicon nitride film 53 is removed by using a phosphoric acid boiling solution or the like and the silicon oxide film 52 is removed by using a hydrofluoric acid type wet etching solution or the like, so as to expose the surface of the silicon substrate 1 in the transistor region Refet, which procedures are not shown in the drawing. At this point, a step portion having a sufficient level difference between the surface of the silicon substrate 1 in the transistor region Refet and the top surface of the isolation 2b is exposed characteristically in this embodiment. The level difference is set at approximately 50 through 100 nm in consideration of the amount of over-etch in a procedure for forming sidewalls described below. However, in order to effectively achieve the effects of this embodiment, the thickness of an insulating film for the sidewall and the amount of over-etch are required to be appropriately determined in the subsequent procedure for forming the sidewalls.

Then, as is shown in FIG. 13(c), a polysilicon film 4 is deposited on the silicon substrate 1 and the isolation 2b, and the resist film 50b for exposing an area excluding the areas for a gate electrode and a gate interconnection is formed thereon. Then, the dry etching is conducted by using the resist film 50b as a mask, thereby forming the gate electrode 4a and the gate interconnection 4b, which procedure is not shown in the drawing.

Next, as is shown in FIG. 13(d), by using the gate electrode 4a as a mask, impurity ions at a low concentration are injected, thereby forming a low-concentration source/drain region 6. Then, an insulating film 7 (a silicon oxide film) is deposited on the entire top surface of the substrate.

Then, as is shown in FIG. 13(e), the insulating film 7 is anisotropically etched, thereby forming the electrode sidewalls 7a on the both side surfaces of the gate electrode 4a and interconnection sidewalls 7b on the both side surfaces of the gate interconnection 4b. At the same time, a step sidewall 7c is formed on the side surface of the step portion between the silicon substrate 1 in the transistor region Refet and the isolation 2b. After forming these sidewalls, impurity ions are injected, thereby forming the high-concentration source/drain region 8. Also at this point, the step portion between the silicon substrate 1 in the transistor region Refet and the isolation 2b has the sufficient level difference.

Although the procedures thereafter are not shown in the drawing, an upper gate electrode 9a, an upper gate interconnection 9b and a source/drain electrode 9c are formed by a silicifying procedure, an interlayer insulating film 11 is deposited and a contact hole is formed, and then the contact hole is filled with a metal, and a first layer metallic interconnection 12 is formed. In this manner, the MOS transistor having the trench isolation structure as shown in FIG. 12 is manufactured.

In the aforementioned procedures, the electrode sidewalls 7a and the like are formed in order to manufacture a transistor with the LDD structure. However, the electrode sidewalls 7a and the like can be formed in a transistor having the so-called pocket injection structure, in which a punch-through stopper is formed by injecting an impurity of a different conductivity type into an area between the source/drain region and the channel region. Therefore, this embodiment is applicable to such a transistor having the pocket injection structure.

In manufacturing a MOS transistor having a gate length of 1 μm or less as in this embodiment, it is necessary to form the electrode sidewalls 7a on the side surfaces of the gate electrode 4a in order to provide the transistor with the LDD structure or the pocket injection structure in which the short channel effect can be suppressed and the reliability of the transistor can be ensured. The thickness of the electrode sidewall 7a depends upon the characteristics of a device to be manufactured. Since the sidewall is formed by dry etching with high anisotropy, its thickness can be controlled substantially only by controlling the thickness of the film to be deposited. However, 10% through 30% over-etch is generally conducted in consideration of the fluctuation in the etching rate in the wafer and the fluctuation in the thickness of the deposited film. For example, when the electrode sidewall 7a is formed out of an insulating film with a thickness of 100 nm, the etching is conducted for a time period corresponding to time required for removing an insulating film with a thickness of 110 through 130 nm.

Figure 21A:
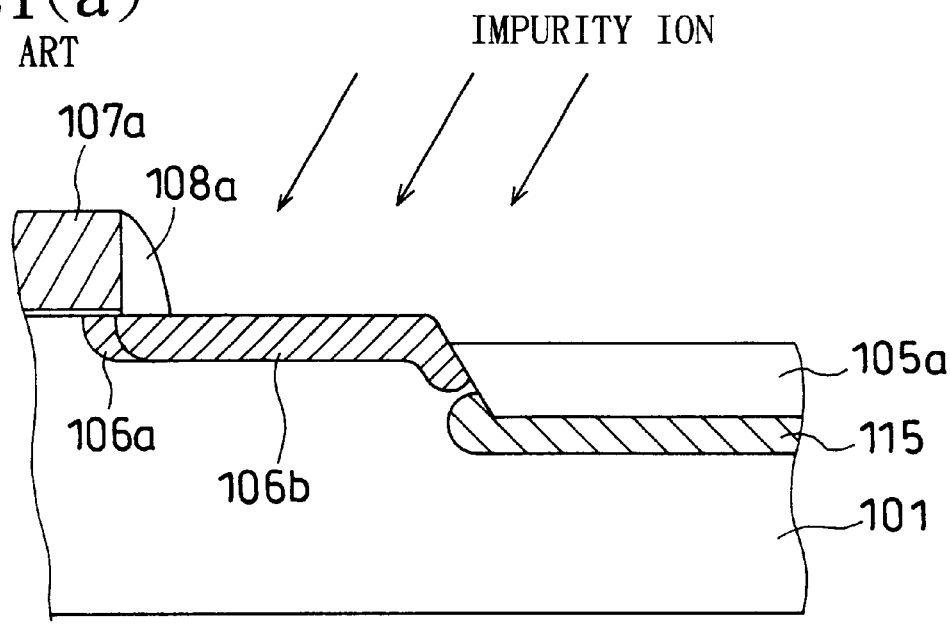
FIGS. 21(a) and 21(b) are partial sectional views for showing problems, in a conventional semiconductor device having a trench isolation, occurring in an impurity ion injection process and a silicifying process, respectively.
Figure 21B:
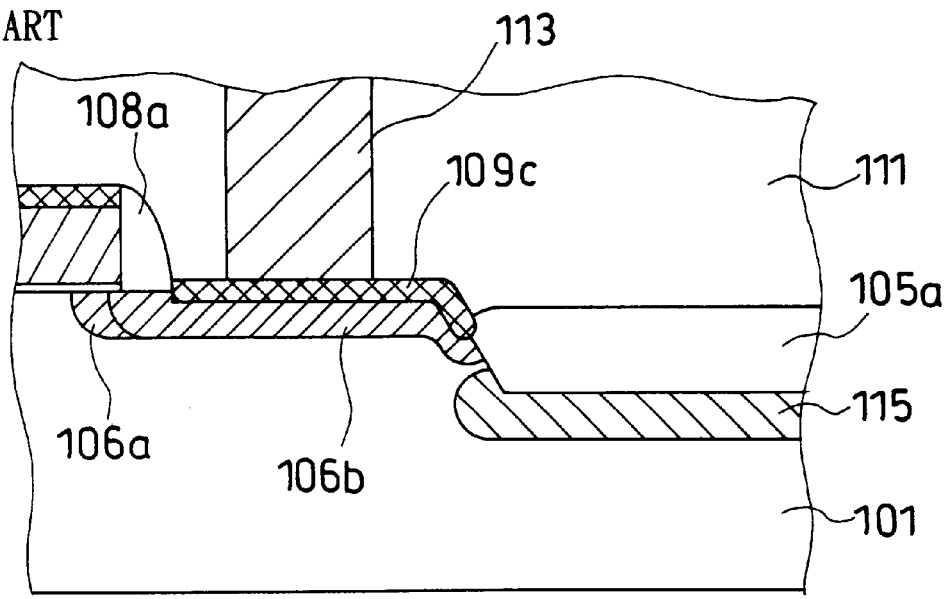

At this point, the isolation 2b made of an oxide film is etched at higher selectivity than the silicon substrate 1 in the transistor region Refet, and hence, the isolation 2b is removed by a thickness of, for example, 10 through 30 nm. Therefore, in the conventional structure, the surface of the isolation 105a becomes lower than the surface of the silicon substrate 101 as is shown in FIGS. 21(a) and 21(b), resulting in causing the aforementioned problems. In contrast, in the state of this embodiment shown in FIG. 13(d), the isolation 2b has the step portion whose surface is higher than the surface of the silicon substrate in the transistor region Refet, resulting in effectively preventing the problems. In other words, even when the impurity ions are diagonally injected for the formation of the high-concentration source/drain region 8, the impurity ions are prevented from being implanted below the edge of the isolation 2b because the step portion of the isolation 2b has a sufficient level difference. Accordingly, a distance between the high-concentration source/drain region 8 and the channel stop region 60 can be made substantially constant, thereby preventing the degradation of the junction voltage resistance and the increase of the junction leakage. Furthermore, in the formation of the source/drain electrode 9c of silicide on the high-concentration source/drain region 8, the step sidewall 7c effectively prevents the silicide layer from being formed in the boundary between the silicon substrate 1 and the isolation 2b. Therefore, it is possible to effectively prevent a short circuit current from occurring between the source/drain electrode 9c and the channel stop region 60.

In order to effectively achieve the aforementioned effects in this embodiment, however, the level difference caused by the step portion is preferably larger than the amount of over-etch in the formation of the sidewalls, that is, 10 through 30 nm. Furthermore, in practical use, after the formation of the isolation 2b, other procedures are conducted in which the thickness of the silicon oxide film used as the isolation 2b is decreased, such as a procedure for removing the silicon oxide film 52. Therefore, it is preferred that the step portion is previously formed so as to have a sufficiently large level difference also in consideration of the afterward decreased amount. Accordingly, the lower limit of the thickness of the silicon nitride film 53 deposited in the procedure shown in FIG. 13(a) is determined on the basis of the amount of over-etch and the etched amount in the procedure for removing the silicon oxide film 52.

In this embodiment, the silicon nitride film 53 is used as an etching mask for forming the trench 51. This film can be made of any material which has large etching selectivity against the silicon oxide film, and can be, for example, a polysilicon film or the like.

This embodiment exemplifies the so-called salicide structure in which the upper gate electrode 9a and the source/drain electrode 9c are simultaneously silicified in a self-aligned manner for attaining low resistance. It goes without saying that the embodiment is applicable to a structure in which a gate electrode is previously formed as a polycide electrode and a source/drain electrode alone is silicified afterward.

(Embodiment 9)

Embodiment 9 will now be described referring to FIGS. 14(a) through 14(e). This embodiment is different from Embodiment 8 in that a gate oxide film and a polysilicon film serving as a gate electrode are deposited before forming a trench isolation.

Figure 14A:
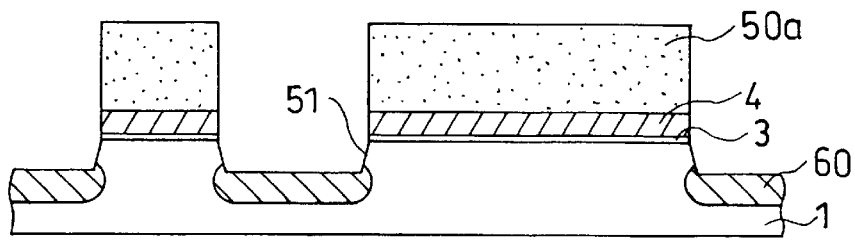
FIGS. 14(a) through 14(e) are sectional views for showing manufacturing procedures for a semiconductor device of Embodiment 9.

First, as is shown in FIG. 14(a), a gate oxide film 3 and a polysilicon film 4 serving as a gate electrode of a MOS transistor are successively deposited on a silicon substrate 1. A resist film 50a for exposing an isolation region Reiso and masking a transistor region Refet is patterned. By using the resist film 50a as a mask, the polysilicon film 4 and the gate oxide film 3 are selectively removed, and further the silicon substrate 1 is etched, thereby forming a trench 51 serving as the isolation region. At this point, differently from the conventional method of forming a trench, the thickness of the polysilicon film 4 is set at 150 through 200 nm, that is, substantially the same thickness as that of the silicon nitride film used in Embodiment 8. The gate oxide film 3 has a thickness of 10 through 20 nm. The depth of the trench 51 is approximately 500 nm. Then, impurity ions of a different conductivity type from that of an impurity to be injected into a source/drain region formed afterward are injected, thereby forming a channel stop region 60.

Then, after removing the resist film 50a, a silicon oxide film 2 (not shown) is deposited so as to have a sufficient thickness larger than the sum of the depth of the trench 51 and the thickness of the remaining polysilicon film 4, namely, the height from the bottom of the trench 51 to the top surface of the polysilicon film 4. The silicon oxide film 2 is removed by the CMP method until the surface of the polysilicon film 4 is exposed, thereby flattening the top surface of the substrate. Through this procedure, a trench isolation 2b made of the silicon oxide film is formed in the isolation region Reiso. The flattening method to be adopted is not limited to that described above but the surface can be flattened by etch-back using a resist film having a reverse pattern to the pattern of the transistor region Refet.

Figure 14B:
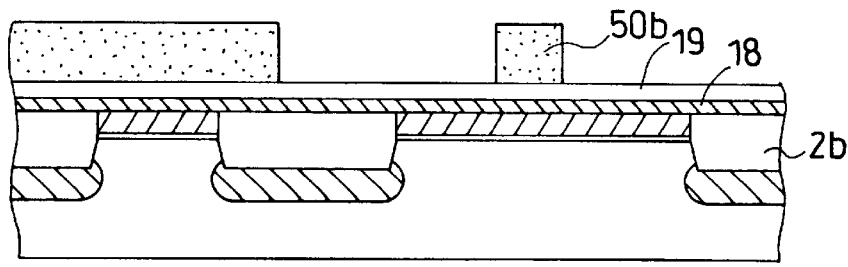

Next, as is shown in FIG. 14(b), a conductive film 18 serving as a gate interconnection layer (which can be made of a conductive polysilicon film; a silicide film of WSi, TiSi or the like; or a metal with a high melting point such as W with a sandwiched barrier metal such as TiN for achieving low resistance) and a protection film 19 made of an insulating film are deposited on the flattened substrate. Then, a resist film 50b for exposing an area excluding the areas for a gate electrode and a gate interconnection is formed. By using the resist film 50b as a mask, dry etching is conducted, thereby forming a gate electrode 4a, an upper gate electrode 18a and a protection film 19a, a gate interconnection 4b, an upper gate interconnection 18b and a protection film 19b, which procedures are not shown in the drawing. At this point, a step portion having a sufficient level difference between the surfaces of the silicon substrate 1 in the transistor region Refet and the isolation 2b is exposed characteristically in this embodiment. The level difference is approximately 50 through 100 nm in consideration of the amount of over-etch in the subsequent procedure for forming sidewalls and the like. However, in order to effectively achieve the effects of this embodiment, the thickness of an insulating film for the sidewall and the amount of over-etch are required to be appropriately determined in the subsequent procedure for forming the sidewalls.

Figure 14C:
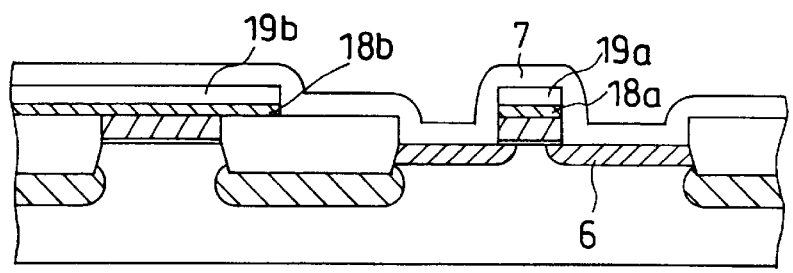

Then, as is shown in FIG. 14(c), similarly to Embodiment 8, after forming a low-concentration source/drain region 6 on either side of the gate electrode 4a in the active area, an insulating film 7 (silicon oxide film) is deposited on the entire top surface of the substrate.

Figure 14D:
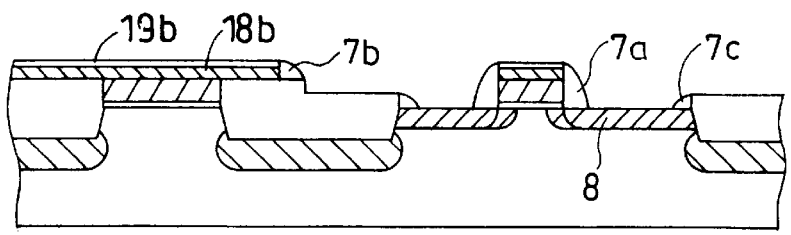

Next, as is shown in FIG. 14(d), the insulating film 7 is anisotropically etched, thereby forming electrode sidewalls 7a on both side surfaces of the gate electrode 4a and the like and interconnection sidewalls 7b on both side surfaces of the gate interconnection 4b and the like. At the same time, a step sidewall 7c is formed on the side surface of the step portion between the silicon substrate 1 in the transistor region Refet and the isolation 2b. After forming these sidewalls, impurity ions are injected, thereby forming a high-concentration source/drain region 8. Also at this point, the step portion between the silicon substrate 1 in the transistor region Refet and the isolation 2b has a sufficient level difference.

Figure 14E:
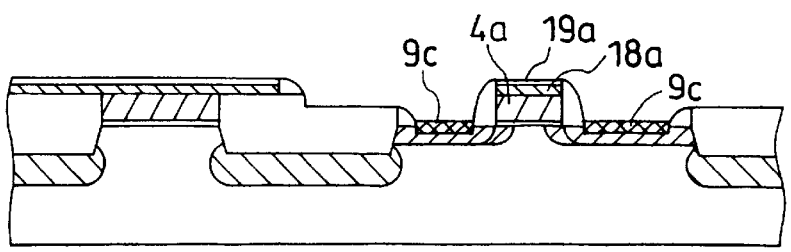

Next, as is shown in FIG. 14(e), a source/drain electrode 9c is formed out of silicide only on the high-concentration source/drain region 8.

Although the procedures thereafter are not shown in the drawing, an interlayer insulating film 11 is deposited, a contact hole is formed, and the contact hole is filled with a metal (such as tungsten), and a first layer metallic interconnection 12 is formed. Thus, a MOS transistor having a trench isolation similar to that shown in FIG. 12 is manufactured. In this embodiment, however, on the gate electrode 4a and the gate interconnection 4b are formed the upper gate electrode 18a and the upper gate interconnection 18b made of conductive polysilicon, silicide or the like as well as the protection films 19a and 19b made of the insulating film, respectively. The source/drain electrode 9c of silicide is formed in the procedure different from that for forming the upper gate electrode 18a and the upper gate interconnection 18b.

In this manner, the step portion which is higher at the side closer to the isolation 2b is formed between the silicon substrate1 in the transistor region Refet and the isolation 2b, and the step portion is provided with the step sidewall 7c on its side surface in this embodiment. Therefore, the same effects as those of Embodiment 8 can be exhibited with a reduced number of manufacturing procedures.

In addition, the procedure for forming the gate electrode 4a and the gate interconnection 4b after the procedure shown in FIG. 14(b) can be conducted on the completely flat top surface of the substrate without being affected by the step portion at the edge of the isolation 2b in this embodiment.

Therefore, a refined pattern can be advantageously stably formed.

(Embodiment 10)

Embodiment 10 will now be described referring to FIGS. 15(a) through 15(f), which are sectional views for showing manufacturing procedures for a semiconductor device of this embodiment.

Before achieving the state shown in FIG. 15(a), a trench isolation 2b, a channel stop region 60, a low-concentration source/drain region 6, a gate insulating film 3, a gate electrode 4a, a gate interconnection 4b and the like are formed through the same procedures as those described in Embodiment 8. Then, a protection oxide film 31, a silicon nitride film 32 for sidewalls and a polysilicon film 33 for a mask are deposited on the substrate by the CVD method. At this point, the thickness of a polysilicon film to be used as the gate electrode 4a and the gate interconnection 4b is 330 nm, and the minimum line width is 0.35 μm. The protection oxide film 31 has a thickness of approximately 20 nm, the silicon nitride film 32 has a thickness of approximately 30 nm, and the polysilicon film 33 has a thickness of approximately 100 nm.

Then, as is shown in FIG. 15(b), the polysilicon film 33 is etched back by RIE (reactive ion etching), thereby forming electrode polysilicon masks 33a, interconnection polysilicon masks 33b and a step polysilicon mask 33c on side surfaces of the gate electrode 4a, the gate interconnection 4b and a step portion of the isolation 2b, respectively. At this point, the etching selectivity between the polysilicon film 33 and the silicon nitride film 32 is large.

Next, as is shown in FIG. 15(c), by using the remaining polysilicon masks 33a, 33b and 33c as masks, wet etching using heated phosphoric acid ($H_3PO_4$) at 150° C. is conducted, so as to have portions of the silicon nitride film 32 covered with the polysilicon masks 33a, 33b and 33c remained and remove the other portions thereof. At this point, the etching selectivity between the silicon nitride film 32 and the polysilicon masks 33a, 33b and 33c can be approximately 30:1. Through this procedure, electrode sidewalls 32a, interconnection sidewalls 32b and a step sidewall 32c each having an L-shape remain on the sides of the gate electrode 4a, the gate interconnection 4b and the step portion, respectively.

Then, as is shown in FIG. 15(d), by using the gate electrode 4a, the protection oxide film 31, the electrode polysilicon mask 33a, the electrode sidewall 32a, the step polysilicon mask 33c and the step sidewall 32c as masks, impurity ions are injected at a high concentration into the active area of the silicon substrate 1, thereby forming a high-concentration source/drain region 8.

Then, as is shown in FIG. 15(e), the polysilicon masks 33a, 33b and 33c are removed by dry or wet etching.

Next, as is shown in FIG. 15(f), exposed portions of the protection oxide film 31 on the substrate are removed by using a HF type etching solution. Then, a titanium film is deposited and a first RTA treatment is conducted, thereby forming a silicide layer of a $TiSi_2$ film through the reaction between titanium and silicon. The titanium film is then removed, and a second RTA treatment is conducted, so that an upper electrode 9a, an upper interconnection 9b and a source/drain electrode 9c each of a silicide layer with a low resistance are formed on the gate electrode 4a, the gate interconnection 4b and the source/drain region 8, respectively. Thereafter, an interlayer insulating film is deposited, the top surface of the substrate is flattened, a contact hole is formed, a metallic interconnection film is deposited, and a metallic interconnection is formed. Thus, an LSI is manufactured.

Since the protection oxide film 31 and the L-shaped step sidewall 32c are formed on the side surface of the step portion in the procedure shown in FIG. 15(f) in this embodiment, the silicide layer is effectively prevented from being formed in the boundary between the active area of the silicon substrate 1 and the isolation 2b.

Furthermore, since the protection oxide film 31 is formed on the isolation 2b and the active area of the silicon substrate 1 in the procedures shown in FIGS. 15(c) and 15(d), the thickness of the isolation 2b is never decreased through the formation of the L-shaped sidewalls 32a, 32b and 32c. Accordingly, it is possible to decrease the level difference between the isolation 2b and the silicon substrate 1, resulting in improving the patterning accuracy for the gate.

In the formation of the gate electrode, first and second conductive films can be used similarly to Embodiment 2. Also in this case, the same effects as those of this embodiment can be exhibited.

(Embodiment 11)

In each of the aforementioned embodiments, each sidewall is made of an insulating material such as a silicon oxide film and a silicon nitride film. The sidewall can be made of a conductive material such as a polysilicon film. FIG. 16(a) through 16(e) are sectional views for showing manufacturing procedures for a semiconductor device including conductive sidewalls.

Figure 16A:
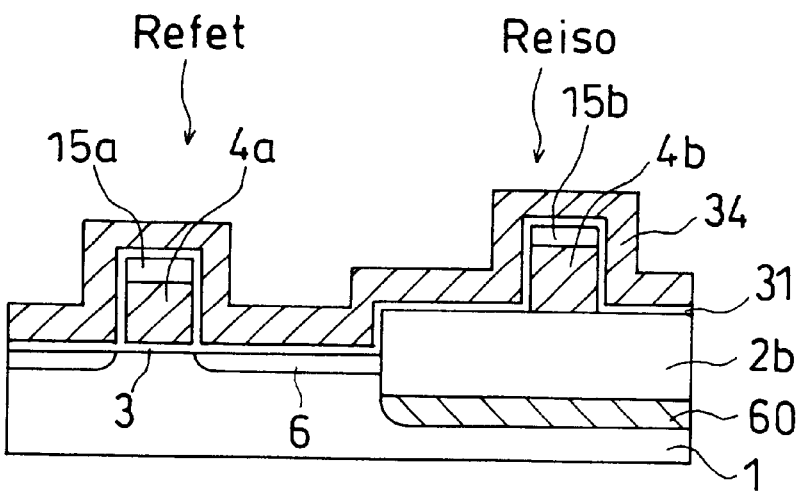
FIGS. 16(a) through 16(e) are sectional views for showing manufacturing procedures for a semiconductor device of Embodiment 11.

Before attaining the state shown in FIG. 16(a), a trench isolation 2b, a channel stop region 60, a low-concentration source/drain region 6, a gate insulating film 3, a gate electrode 4a, a gate interconnection 4b and the like are formed through the same procedures as those described in Embodiment 8. Then, a protection oxide film 31 and a polysilicon film 34 for sidewalls are deposited on the top surface by the CVD method. In this embodiment, on the gate electrode 4a and the gate interconnection 4b are formed protection silicon oxide films 15a and 15b, respectively. At this point, a polysilicon film to be used as the gate electrode 4a and the gate interconnection 4b has a thickness of 330 nm, and the minimum line width is 0.35 $\mu$m. The protection oxide film 31 has a thickness of approximately 20 nm and the polysilicon film 34 has a thickness of approximately 100 nm.

Figure 16B:
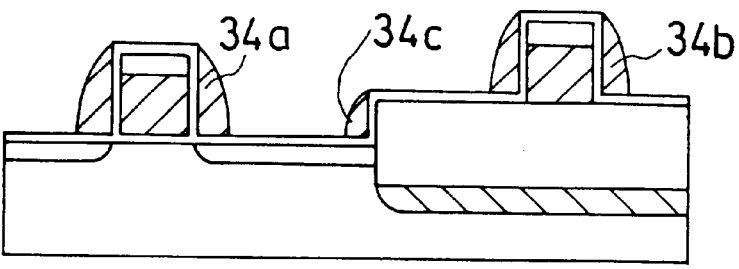

Next, as is shown in FIG. 16(b), the polysilicon film 34 is etched back by the RIE, thereby forming electrode sidewalls 34a, interconnection sidewalls 34b and a step sidewall 34c each made of the polysilicon film on sides of the gate electrode 4a, the gate interconnection 4b and a step portion of the isolation 2b, respectively.

Figure 16C:
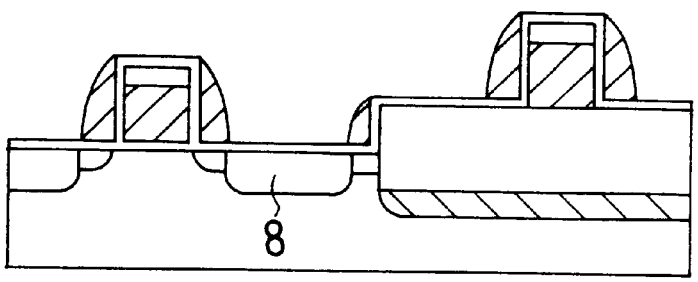

Next, as is shown in FIG. 16(c), by using the gate electrode 4a, the protection oxide film 31, the electrode sidewalls 34a and the step sidewall 34c as masks, impurity ions are injected at a high concentration into an active area of the silicon substrate 1, thereby forming a high-concentration source/drain region 8.

Figure 16D:
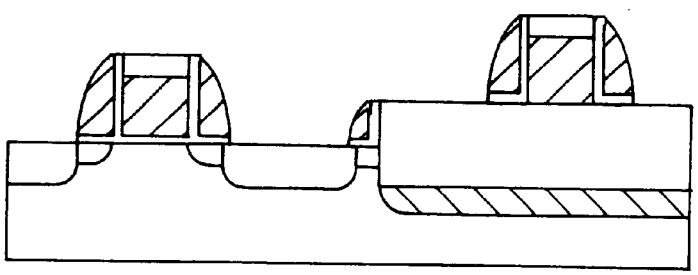
Figure 16E:
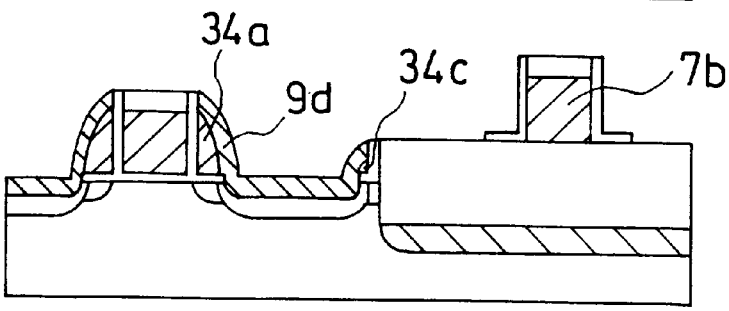

Then, as is shown in FIG. 16(d), exposed portions of the protection oxide film 31 on the substrate are removed by using the HF type etching solution. Then, as is shown in FIG. 16(e), a titanium film is deposited and a first RTA treatment is conducted, thereby forming a silicide layer made of a TiSi$_2$ film through the reaction between titanium and silicon. The titanium film is then removed and a second RTA treatment is conducted, thereby forming a source/drain electrode 9d made of a silicide layer stretching over the electrode sidewall 34a, the high-concentration source/drain region 8 and the step sidewall 34c. Since the silicide layer is formed also on the interconnection sidewall 34b, this silicide layer can be connected with the source/drain electrode. Therefore, in this embodiment, etching is conducted on the isolation 2b by using a resist film or the like, so as to selectively remove the interconnection sidewalls 34b on the sides of the gate interconnection 4b as well as the silicide layer thereon. Thus, the source/drain electrodes 9d in the respective active areas are prevented from being mutually connected. It is possible to selectively remove merely the interconnection sidewalls 34b on the sides of the gate interconnection 4b immediately after forming the sidewalls 34a, 34b and 34c of the polysilicon film.

Thereafter, an interlayer insulating film is deposited, the top surface of the substrate is flattened, a contact hole is formed, a metallic interconnection film is deposited, and a metallic interconnection is formed. Thus, an LSI is manufactured.

In this embodiment, the source/drain electrode 9d is ultimately formed so as to stretch over a large area including the electrode sidewall 34a, the high-concentration source/drain region 8 and the step sidewall 34c. Accordingly, the level difference between the transistor region Refet and the isolation 2b can effectively prevent the high-concentration source/drain region 8 from being brought close to the channel stop region 60 in the impurity ion injection. Furthermore, in the formation of the source/drain electrode 9d of silicide on the high-concentration source/drain region 8, also the step sidewall 34c is silicified by a certain thickness. However, since the silicide layer is prevented from being formed in a further thickness, a short circuit current between the source/drain electrode 9d and the channel stop region 60 is effectively prevented from being caused by the formation of the silicide layer in the interface between the isolation and the silicon substrate. Moreover, since the large area stretching over the electrode sidewall 34a, the high-concentration source/drain region 8 and the step sidewall 34c is silicified in this embodiment, it is very easy to form a contact member to be connected with an upper first layer interconnection. As a result, the area of the transistor region Refet can be decreased, namely, the integration of the semiconductor device can be advantageously improved. Although the electrode sidewalls 34a and the interconnection sidewalls 34b are made of a conductive polysilicon film, there is no possibility of a short circuit between the sidewall and the gate because the respective sidewalls 34a and 34b are insulated from the gate electrode 4a and the gate interconnection 4b by the protection oxide film 31.

In the formation of the gate electrode, first and second conductive films can be used similarly to Embodiment 9, and also in this case, the same effects as those of this embodiment can be attained.

The sidewalls are made of a polysilicon film in this embodiment, and the polysilicon film can be replaced with an amorphous silicon film. Furthermore, the sidewalls can be made not only of a silicon film but also of another conductive material such as a metal, and it is not necessarily required to silicify the sidewalls.

In each of the aforementioned embodiments, the description is made on the case where the semiconductor element formed in the active area is a field effect transistor. However, the invention is not limited to these embodiments, and is applicable when the semiconductor element is a bipolar transistor and the active area is an emitter diffused layer, a collector diffused layer or a base diffused layer of the bipolar transistor.

In each embodiment, setting of an angle of the side surface of the step portion to be equal to or more than 70° C. ensures a large level difference between the active area and the side surface of the step portion around the boundary of the active area, thereby preventing formation of a deep recess on the isolation.

What is claimed is:

1. A semiconductor device in which a MOSFET is disposed in each of plural active areas in a semiconductor substrate comprising:

a gate insulating film and a gate electrode formed on each of the active areas;

a source region and a drain region formed in each of the active areas on opposite sides of the gate electrode;

a trench isolation for surrounding and isolating each of the active areas, the trench isolation having a first top surface at a higher level than a surface of the active area, a second top surface at a higher level than a surface of the active area and at a lower level than the first top surface, and in a boundary with the active area, a step portion of which side surface is at a substantially right angle to a surface of the semiconductor substrate, the trench isolation being made of an insulating material buried in a trench in the semiconductor substrate which is formed by removing a portion of the semiconductor substrate with a predetermined thickness;

a layered film formed on the trench isolation and on the active area having the gate electrode formed thereon, the layered film comprising an upper film and a lower film each made of an insulating material;

an interlayer insulating film formed directly on the entire surface of the layered film, the interlayer insulating film having a substantially plane surface;

a hole formed by removing respective portions of the interlayer insulating film and the layered film disposed on the active area and by removing respective portions of the interlayer insulating film and the layered film disposed on the trench isolation;

a buried conductive layer filled in the hole; and an interconnection member formed on the interlayer insulating film so as to be connected with the buried conductive layer, wherein the interlayer insulating film is formed on the upper film of the layered film, and the upper film has etching selectivity against the interlayer insulating film, and wherein the buried conductive layer has a first bottom portion in contact with a portion of the surface of the active area and a second bottom portion in contact with the second top surface of the trench isolation.

2. The semiconductor device of claim 1, wherein the lower film of the layered film is a silicon oxide film and the upper film is a silicon nitride film.

3. The semiconductor device of claim 1, wherein the buried conductive layer comprises a plug underlying film made of a TiN/Ti film and a W plug.

4. The semiconductor device of claim 1, further comprising:

electrode sidewalls formed on side surfaces of the gate electrode, respectively, the electrode sidewalls each comprising an insulating material; and a step sidewall formed on a side surface of the step portion of the trench isolation, the step sidewall comprising an insulating material.

5. The semiconductor device of claim 3 further comprising a gate interconnection formed on the trench isolation, the gate interconnection comprising the same material as the gate electrode, wherein:

the holes is formed so as to stretch over at least a portion of the source/drain region, a portion of the trench isolation and a portion of the gate interconnection, and the buried conductive layer is connected with the gate interconnection formed on the trench isolation.

6. The semiconductor device of claim 4 further comprising a gate protection film formed on the gate electrode, wherein the hole is formed so as to stretch over at least a portion of the source/drain region and a portion of the gate protection film, said portion of the gate protection film having the buried conductive layer formed thereon.

7. The semiconductor device of claim 1, wherein the interlayer insulating film is a silicon oxide film and an upper film of the layered film is a silicon nitride film.

8. A semiconductor device in which a MOSFET is disposed in each of plural active areas in a semiconductor substrate comprising:

a gate insulating film and a gate electrode formed on each of the active areas;

a source region and a drain region formed in each of the active areas on opposite sides of the gate electrode;

a trench isolation for surrounding and isolating each of the active areas, the trench isolation having a first top surface at a higher level than a surface of the active area and a second top surface at a higher level than a surface of the active area and at a lower level than the first top surface, the trench isolation being made of a first silicon oxide film buried in a trench in the semiconductor substrate which is formed by removing a portion of the semiconductor substrate with a predetermined thickness;

a layered film formed on the trench isolation and on the active area having the gate electrode formed thereon, the layered film comprising a second silicon oxide film forming a lower film and a silicon nitride film forming an upper film;

an interlayer insulating film formed directly on the entire surface of the silicon nitride film, the interlayer insulating film comprising a silicon oxide film having a substantially plane surface;

a hole formed by removing respective portions of the interlayer insulating film and the layered film disposed on the active area and by removing respective portions of the interlayer insulating film and the layered film disposed on the trench isolation;

a buried conductive layer filled in the hole; and an interconnection member formed on the interlayer insulating film so as to be connected with the buried conductive layer, wherein a portion of the trench isolation exposed in the hole has the second top surface.

9. The semiconductor device of claim 8, wherein the buried conductive layer comprises a plug underlying film made of a TiN/Ti film and a W plug.

10. The semiconductor device of claim 8 further comprising:

electrode sidewalls formed on side surfaces of the gate electrode, respectively, the electrode sidewalls each comprising a silicon insulating material; and a step sidewall formed on a side surface of the step portion of the trench isolation, the step sidewall comprising an insulating material.

11. The semiconductor device of claim 10 further comprising a gate interconnection formed on the trench isolation, the gate interconnection comprising the same material as the gate electrode, wherein:

the hole is formed so as to stretch over at least a portion of the source/drain region, a portion of the trench isolation and a portion of the gate interconnection, and the buried conductive layer is connected with the gate interconnection formed on the trench isolation.

12. The semiconductor device of claim 10 further comprising a gate protection film formed on the gate electrode, wherein the hole is formed so as to stretch over at least a portion of the source/drain region and a portion of the gate protection film, said portion of the gate protection film having the buried conductive layer formed thereon.

* * * * *